(12) United States Patent
Sunter et al.

(10) Patent No.: US 6,204,694 B1
(45) Date of Patent: Mar. 20, 2001

(54) PROGRAMMABLE CLOCK SIGNAL GENERATION CIRCUITS AND METHODS FOR GENERATING ACCURATE, HIGH FREQUENCY, CLOCK SIGNALS

(75) Inventors: Stephen Kenneth Sunter, Nepean; Aubin P. J. Roy, Hull, both of (CA)

(73) Assignee: LogicVision, Inc., San Jose, CA (US)

( * ) Notice: Subject to any disclaimer, the term of this patent is extended or adjusted under 35 U.S.C. 154(b) by 0 days.

(21) Appl. No.: 09/316,197

(22) Filed: May 21, 1999

(51) Int. Cl.[7] .................................................... H03K 19/00

(52) U.S. Cl. .............................................. 326/93; 331/57

(58) Field of Search ................................ 326/93, 95, 96; 327/141, 142, 145; 331/57

(56) References Cited

U.S. PATENT DOCUMENTS

| | | | |
|---|---|---|---|
| 4,517,532 | 5/1985 | Neidorff | 331/57 |
| 5,013,944 | 5/1991 | Fischer et al. | 307/603 |
| 5,471,176 | 11/1995 | Henson et al. | 331/1 A |
| 5,550,489 | * 8/1996 | Raab | 326/93 |
| 5,815,043 | 9/1998 | Chow et al. | 331/57 |

OTHER PUBLICATIONS

James A. Gasbarro and Mark A. Horowitz, "Integrated Pin Electronics for VLSI Functional Testers", *IEEE Journal of Solid–State Circuits*, vol. 24, No. 2, Apr. 1989, pp. 331–333.

* cited by examiner

*Primary Examiner*—David Nelms
*Assistant Examiner*—David Lam
(74) *Attorney, Agent, or Firm*—Killworth, Gottman, Hagan & Schaeff, L.L.P.

(57) ABSTRACT

A circuit and method is described which generates a high frequency clock signal whose frequency is accurate enough to be used for testing other circuitry, yet the circuit can be described using a hardware description language so that it is suitable for logic synthesis and automatic layout. The technique uses a plurality of programmable ring oscillators and means to select and enable one of the ring oscillators. The output frequency is measured relative to that of a lower frequency reference signal, and when the output frequency is incorrect, a different ring oscillator is selected or the present ring oscillator's frequency is changed. Circuitry is included to prevent glitches at the output of the clock generator when the frequency is changed, regardless of how the ring oscillators are constructed. One or more of the delay stages in the ring oscillators contain parallel 3-state logic gates which allow delay changes less than the delay of a single non-inverting delay gate, and this allows the frequency to be very accurately controlled.

28 Claims, 15 Drawing Sheets

*Fig. 1* (Prior Art)
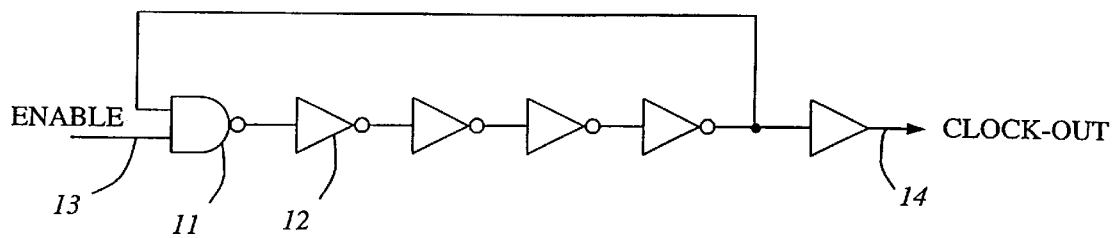
*Fig. 2* (Prior Art)
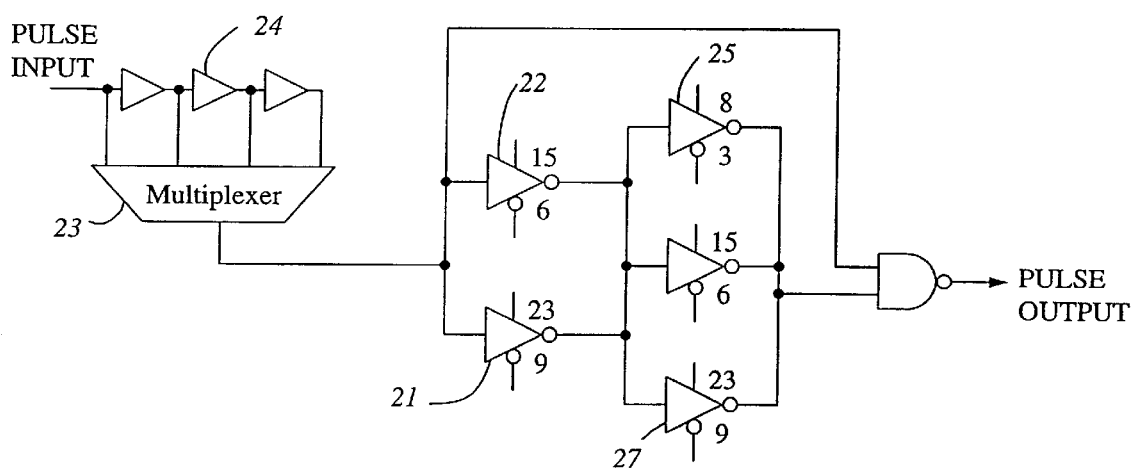
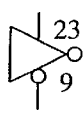 3-state buffer, with p-channel (top number) and n-channel transistor (bottom number) sizes shown

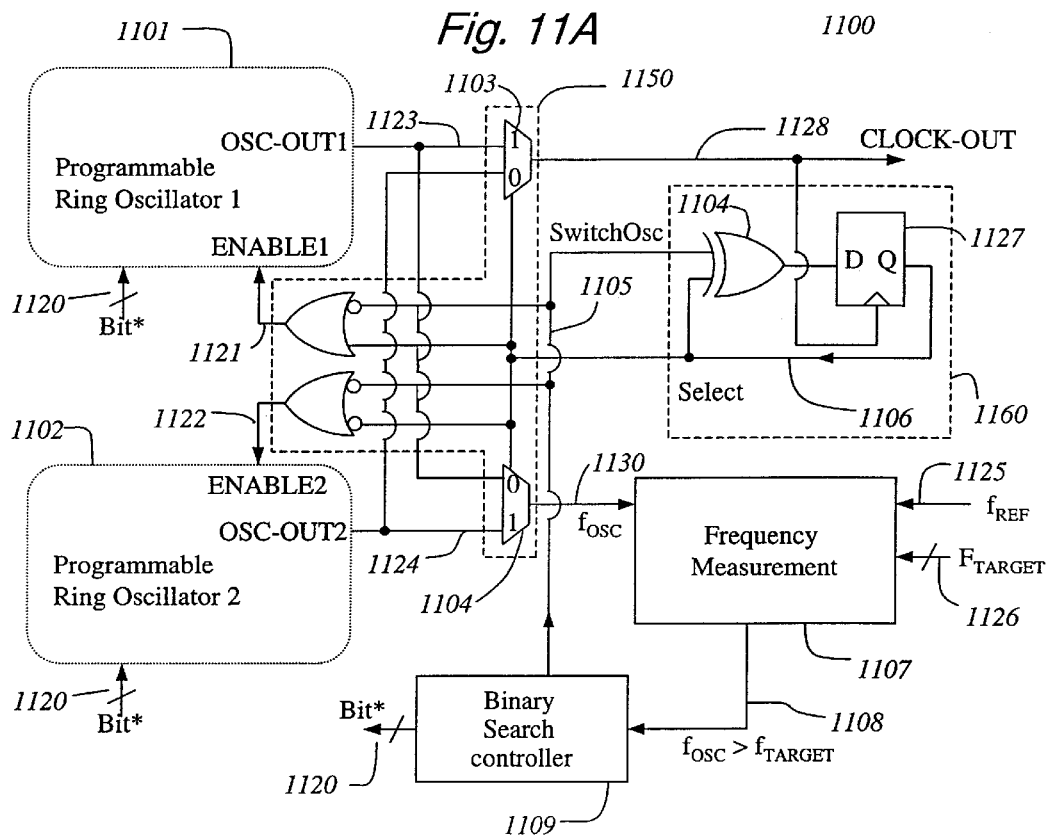

PROGRAMMABLE CLOCK SIGNAL GENERATION CIRCUITS AND METHODS FOR GENERATING ACCURATE, HIGH FREQUENCY, CLOCK SIGNALS

This invention relates to programmable clock signal generation circuits and methods for generating accurate, high frequency, clock signals, and especially to programmable clock signal generation circuits suitable for generation of clock signals for testing integrated circuits (ICs), especially application-specific ICs (ASICs) in which logic circuits are designed using a hardware description language (HDL), synthesized into logic gates, and automatically arranged in a layout to form an ASIC's physical design.

BACKGROUND OF THE INVENTION

When testing high speed Integrated Circuits (ICs), it is desirable to test them using signals whose frequencies are equal to the specified operating frequencies of the IC. Built-In Self-Test (BIST), which requires supplying on-chip generated patterns to a Circuit Under Test (CUT), is often able to generate signals at the required frequencies using only a master clock signal supplied to the IC at the appropriate frequency. However, generating even one high frequency clock for a high speed IC is difficult if the Automatic Test Equipment (ATE) testing the IC does not have a frequency range high enough. Some manufacturers place crystal oscillator on the ATE interface board to generate the high frequency clock (e.g. 50 to 200 MHz). However, this is not a general solution, especially for application-specific ICs (ASICs) in which logic circuits are designed using a hardware description language (HDL), synthesized into logic gates, and automatically arranged in a layout to form an ASIC's physical design. The crystal oscillator must be changed for each ASIC type tested, and several crystal oscillators may be required for a single ASIC.

For many years, designers have incorporated ring oscillators into IC designs to generate periodic signals. A ring oscillator of a basic design comprises an odd-number of inverting delay elements 12 connected in series to form a ring 10, as shown in FIG. 1. By using a control signal ENABLE 13, a reset logic gate 11 allows the oscillation to be stopped in a pre-determined state to have power, and allows controlled start-up of oscillation. The fewer the number of logic gates 11, 12, the higher the oscillation frequency of the output clock signal 14, but three is the minimum. The output of a single inverting gate whose output is connected to its input will simply settle to a stable DC voltage mid-way between logic 1 and logic 0.

When the delay elements 12 in a ring oscillator are simple loci inverters as shown in FIG. 1, the oscillation frequency is dependent on temperature, power supply voltage, and variations in the IC manufacturing process. For this reason, digital ring oscillators are generally not used when accurate frequencies are needed. Delay elements comprising analog circuits can be less sensitive, but are generally not suitable for automated design and layout because the exact layout is important for correct operation, and the deign must be re-optimized for each new IC manufacturing process.

Digitally programmable ring oscillators are one solution to the frequency inaccuracy of digital oscillators. In a digitally programmable ring oscillator, by digitally increasing or decreasing the number of delay elements in the ring, the oscillation frequency can be changed. Decreases in the number of delay elements are always achieved by bypassing some delay elements in one way or another, e.g., a programmable ring oscillator disclosed in U.S. Pat. No. 4,517,532 issued to Neidorff in May 1985. In this oscillator, the resolution of frequency changes is limited by the delay of each delay element used because an even number of inverters must always be added or subtracted from the ring to maintain oscillation. Also, each time the number of inverters in the ring is changed, a transient pulse or "glitch" can be generated at the output.

In a paper entitled, "Integrated Pin Electronics for VLSI Functional Testers" (Gasbarrow & Horowitz, April 1989, IEEE Journal of Solid-State Circuits), the authors show a circuit technique, as shown in circuit 20 of FIG. 2, to create a delay line with delay increments less than that of one logic gate. The circuit 20 is used to delay the rising edges of a series of pulses. The designers exploit "the difference in path delay through pairs of carefully sized inverters." The circuit 20 uses a conventional tapped delay line 24 and multiplexer 23 for the larger delay steps, and parallel inverters 21 and 22, and 25–27 for the smaller delay steps. The transistor sizes of the inverts 21–22, 25–27 are shown next to each inverter in FIG. 2.

Certain characteristics of the design by Gasbarrow & Horowitz can be improved. The authors do not explain how to construct their circuit using only logic gates of a single size. Also, the load capacitance presented by one or two logic gate inputs in present IC technologies is usually too small to cause a significant delay change when the drive of a gate is doubled. Their design, as described, is not suitable for automated design.

U.S. Pat. No. 5,013,944 issued to Fischer et al in May 1991 describes a "Programmable Delay Line Utilizing Measured Actual Delays to Provide a Highly Accurate Delay". The delay line is schematically depicted in the circuit 30 of FIG. 3. The delay of a series of delay stages 35, 36, 41 is measured by connecting them in a ring oscillator and the delay paths (e.g., path 33) are selectively bypassed with alternate delay paths (e.g., path 34) as needed until the oscillation frequency, and hence delay, is sufficiently close to a reference frequency. The difference in delay of each pair of paths (e.g., path 33 and path 34) is designed to be an approximate value, specifically, the delay of one or more non-inverting logic gates. The ratio of the delay difference of each pair (e.g., 35) to the next pair (e.g., 36) in the delay line is approximately a factor of two, thus achieving a binary-weighted programmable delay line 30. For smaller delay increments, one delay path 42 contains a first logic gate 37, and the other path 43 in the pair contains a second logic gate 38 that has additional logic gates 39 connected in parallel at its output, to increase its delay relative to the first logic gate 37 by less than one logic gate's delay.

Certain characteristics of the design by Fischer et al can cause problems. When the capacitive wire load on the gates in each of two paths is not well matched, the delay through the path 33 with fewer logic gates can inadvertently become longer than the path 34 with more logic gates in series. This prevents a binary search algorithm from working correctly. Also, because the two paths 42 and 43 are connected to different inputs of logic gate 40, the two inputs can have different switching point voltages which can cause the delay of the shorter path 42 to appear longer than the intended longer path 43. This effect is exacerbated when additional load capacitance is added to the output of a logic gate. These various effects make the design approach unsuitable for automatic layout. Lastly, for the larger delay changes, glitches can be introduced when switch settings are changed.

If accuracy is to be maintained while a ring oscillator's output is clocking other circuitry, the frequency may need to be changed when it varies significantly from its intended value due to changes in the supply voltage or temperature. Changes in the frequency of a programmable ring oscillator need to be 'glitcheless' in such circumstances, otherwise a pulse or 'glitch' can be generated which is shorter than the minimum that the clocked circuitry can tolerate, causing incorrect operation. U.S. Pat. No. 5,471,176 issued to Henson et al in November 1995 describes a Glitchless Frequency-Adjustable Ring Oscillator, an embodiment of which is schematically shown in the circuit 50 of FIG. 4. The circuit 50 seeks to avoid introducing glitches in the output signal 55 when delay stages of a tapped delay line 53 are bypassed by synchronizing the switch activation instant of a synchronized switch 54 to the signal in the oscillation ring 50. It also requires only incrementing or decrementing the binary control code and use of a binary-to-Gray code converter 51, so that only one switch is activated/deactivated for each frequency change. The frequency updates are made precisely when the delay line 53 taps immediately adjacent to the presently accessed tap are known to have the same logic value which is achieved by including delay gates 52. The smallest delay changes are limited to the delay of a single logic gate. When this delay gets very small, this approach is sensitive to wire capacitance and to differences in logic gate switching point voltages, and is therefore not suitable for automatic layout on an IC.

A variation 70 of the tapped delay line is shown in a ring oscillator 60 in FIG. 5 is similar to that disclosed in U.S. Pat. No. 5,815,043 issued to Chow et al in September 1998 entitled "Frequency Controlled Ring Oscillator Having By Passable States". The delay line 70 uses the same principle as that described by Fischer et al. The output frequency 65 of the ring oscillator 60 is compared with a reference frequency 66 in control unit 64, and the delay stages 71, 72 and 73 are selectively bypassed with switches 61, 62 and 63 as needed until the oscillation frequency is sufficiently close to the reference frequency. The bypass switches 61, 62 and 63 are connected across every delay stage 71, 72 or 73, instead of using the tapped delay line 53 of FIG. 4 in which a multiplexer 56 bypasses multiple delay stages. Each delay stage 71, 72 or 73 of the delay line 70 is designed to implement exactly twice the delay of the next smaller delay stage, though the patent recognizes that the factor two will be only approximated in the manufactured circuit. The ring oscillator 60 of FIG. 5 can generate glitches if the bypass switch for a delay stage is changed when the input and output of the delay sage have different logic values. The bypass switches described therein apparently 'short-circuit' the input and output of each delay stage as a means of bypassing the delay stage. Bypass means could be used which do not employ a short-circuit, for example a multiplexer, though this is not mentioned in the patent. However, in this case, when the delay of a delay stage is less than a logic gate delay, differences in wire capacitance or multiplexer input switching point voltages can cause the problems previously described for FIG. 3. To achieve a wide range of frequencies, e.g. with 6 binary-weighted control bits, the maximum frequency is limited to that corresponding to the delay through 6 stages because the number of by-passable delay stages is equal to the number of bits. If fewer stages are used to attain a high maximum frequency, then the frequency range is proportionally reduced.

To allow automated creation of circuitry to perform built-in testing, it is desirable to automatically synthesize an on-chip oscillator whose frequency can be periodically or intermittently measured and adjusted to achieve high accuracy (e.g. <2%) at any frequency up to the maximum typically used in a particular technology. In the prior art described above, high accuracy was not an objective for the chosen applications. However, high accuracy is very important in production testing. It is therefore desirable to provide an accurate programmable ring oscillator whose design can be automatically synthesized from an HDL description to produce a digital circuit suitable for automatic layout in any IC manufacturing technology, with a conventional library of logic gates.

SUMMARY OF THE INVENTION

The present invention comprises a programmable ring oscillator capable of maintaining arbitrarily high accuracy at any frequency up to the maximum frequency that logic circuits normally operate at in a chosen IC technology. Its design can be described in commercially used HDLs to allow automated logic synthesis and layout.

In accordance with an aspect of the present invention, there is provided a programmable clock signal generation circuit for generating a main clock signal. The circuit comprises a plurality of programmable ring oscillators, each ring oscillator having multiple delay stages connected in series to form a ring, at least one of the delay stages having programmable delay to produce an internal clock signal with programmable frequency. The circuit further comprises an oscillator selector for selecting the internal clock signal of one of the ring oscillators to produce the main clock signal, a comparator for comparing the programmable frequency of the selected internal clock signal with a reference frequency to produce a comparison result; and a frequency controller for adjusting the programmable frequency of the selected ring oscillator and controlling the oscillator selector to select the internal clock signal of a different one of the ring oscillators, based on the comparison result.

A main clock signal with a target frequency is provided by forcing the logic level of the main clock signal to a predetermined constant value following a predetermined edge in the main clock signal; adjusting the programmable frequency of a selected ring oscillator when the selected ring oscillator is capable of generating the target frequency, and selecting the internal clock signal of a different one of said ring oscillators when the different one of said ring oscillators is capable of generating the target frequency; resetting the selected ring oscillator so that its internal clock signal becomes the same logic level as the main clock signal; disabling said forcing of the logic level of the main clock signal; and re-enabling the selected ring oscillator so that it begins to oscillate and its internal clock signal drives said main clock signal with the target frequency.

In accordance with another aspect of the invention, there is provided a programmable clock signal generation circuit for generating a main clock signal, comprising first and second oscillator units. At least one of the oscillator units has a plurality of programmable ring oscillators, each ring oscillator having multiple delay stages connected in series to form a ring, at least one of the delay stages having programmable delay to produce an internal clock signal with programmable frequency; and an oscillator selector for selecting the internal clock signal of one of said ring oscillators of the first oscillator unit. The circuit further comprises a unit selector for selecting one of the first and second oscillator units as a main oscillator unit to produce the main clock signal form the internal clock signal of the main oscillator unit, and selecting the other one of the first and second oscillator units as a secondary oscillator unit to produce a secondary clock signal from the internal clock signal of the secondary oscillator unit; a comparator for comparing the programmable frequency of the internal clock signal of a secondary oscillator unit with a reference frequency to produce a comparison result; a frequency controller for adjusting the programmable frequency of the internal clock signal of the secondary oscillator unit and controlling the first and second oscillator selectors to select a different ring oscillator from the secondary oscillator unit, based on the comparison result; and a unit controller for controlling the unit selector to switch the selection between the main oscillator unit and the secondary oscillator unit when frequency adjustment of the secondary oscillator unit is completed.

A main clock signal with a target frequency is generated by selecting one of the oscillator units as a main oscillator unit to produce the main clock signal from the internal clock signal of the main oscillator unit, and selecting the other one of the oscillator units as a secondary oscillator unit to produce a secondary clock signal from the internal clock signal of the secondary oscillator unit; adjusting the programmable frequency of the internal clock signal of the secondary oscillator unit with a reference frequency to produce the internal clock signal with the target frequency; switching the selection between the main oscillator unit and the secondary oscillator unit when frequency adjustment of the secondary oscillator unit is completed; and repeating the steps of adjusting and switching.

Other aspects and features of the present invention will be readily apparent to those skilled in the art from a review of the following detailed description of preferred embodiments in conjunction with the accompanying drawings.

BRIEF DESCRIPTION OF THE DRAWINGS

The present invention will be readily understood with reference to the accompanying drawings, wherein the reference numerals designate structural elements, and in which:

FIG. 1 is a schematic diagram of a conventional ring oscillator, with a reset/enable control input;

FIG. 2 is a schematic diagram of the prior art which achieves arbitrarily small delay increments;

FIG. 11A is a schematic diagram of a circuit for glitchless switching between ring oscillators, in which each ring oscillator's frequency is adjusted while the other is in service, according to an embodiment of the invention;

FIG. 11B is a diagram showing the waveforms for the circuit in FIG. 11A;

DETAILED DESCRIPTION OF THE PREFERRED EMBODIMENTS

Figure 12A:
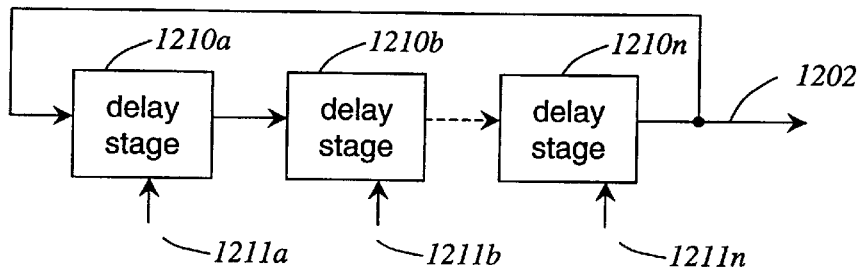
FIG. 12A is a block diagram of a programmable ring oscillator in accordance with an embodiment of the present invention.

FIG. 12A shows an embodiment of a programmable ring oscillator 1200 to which the present invention may be applied. The ring oscillator 1200 comprises one or more programmable delay stages 1210a–1210n connected in series to form a ring. Each delay stage receives a control signal 1211a–1211n so that the frequency of the clock signal 1202 is programmed. The ring oscillator 1200 may also contain one or more non-programmable delay stages (not shown) which provides fixed delays.

Using a general method from the prior art, the output frequency of the programmable ring oscillator 1200 can be measured by counting oscillation cycles during N periods of a known accurate, reference frequency. If the comparison indicates that the output frequency is too high, the programmed setting of the delay stages 1210a–1210n in the ring oscillator 1200 can be changed to decrease the output frequency. Similarly, if the output frequency is too low, the programmed setting can be changed to increase the output frequency.

Figure 12B:
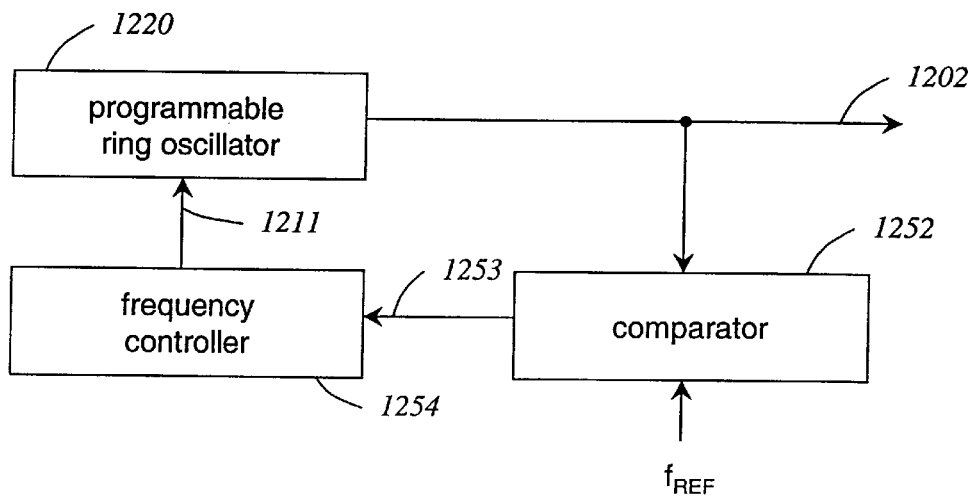
FIG. 12B is a block diagram of a programmable clock signal generation circuit in accordance with an embodiment of the present invention.

FIG. 12B shows an example of a programmable clock signal generation circuit 1250 to which the present invention may be applied. The clock signal generation circuit 1250 uses the ring oscillator 1220. The ring oscillator 1220 may have the same structure as the ring oscillator 1200 shown in FIG. 12A. It may also contain many of the circuit 1200 shown in FIG. 12A.

The clock signal generation circuit 1250 also comprises a comparator 1252 and a frequency controller 1254. The clock signal 1202 output from the ring oscillator 1220 is input to the comparator 1252. The comparator 1252 compares the frequency of the clock signal 1202 with a reference frequency $f_{REF}$ and generates a comparison result 1253. The frequency controller 1254 receives the comparison result 1253, and generates the control signal 1211 to the ring oscillator 1220 based on the comparison result 1253. Thus, the output frequency of the clock signal generation circuit 1250 is controlled.

The clock signal generation circuit 1250 facilitates automated logic synthesis and IC layout of a clock signal generator whose output frequency can be accurately programmed at high frequencies, in the presence of variations in process, temperature, and operating voltage. The circuit 1250 provides a clock signal whose frequency can be periodically or intermittently calibrated by being measured and adjusted relative to the reference frequency. The reference frequency is a known accurate, lower frequency clock.

Figure 12C:
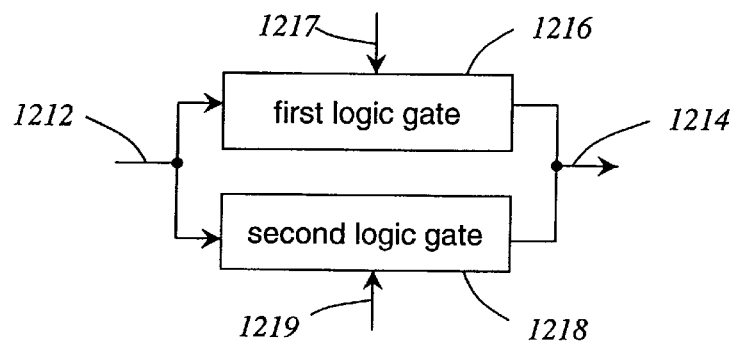
FIG. 12C is a block diagram of a delay stage of the ring oscillator shown in FIG. 12A.

In accordance with the present invention, at least one of the delay stage, e.g., delay stage 1210a shown in FIG. 12A, comprises a first buffer or logic gate 1216 and a second buffer or logic gate 1218, as shown in FIG. 12C.

FIG. 12C shows an example of the delay stage 1210a shown in FIG. 12A. The delay stage 1210a comprises a first buffer or logic gate 1216 and a second buffer or logic gate 1218. The first and second logic gates 1216, 1218 are connected in parallel between a delay stage input 1212 and a delay stage output 1214. The delay stage input 1212 is connected to a delay stage output of the previous delay stage, and the delay stage output 1214 is connected to a delay stage input of the next delay stage. The first and second logic gates 1216, 1218 receive control bits 1217, 1219, respectively. The control bits 1217, 1219 correspond to the control signal 1121a in FIG. 12A. By using the delay stage 1210a, delay steps less than the delay of one logic gate are accomplished.

The delay stage 1210a connects each path of the first and second logic gates 1216, 1218 to the same input of the next logic stage, and does not rely on two alternative paths differing in delay by some portion of a logic gate delay.

Using of the delay stage 1210a in the clock signal generation circuit 1250 enables highly accurate frequencies because the delay increments in the delay stages and hence frequency decrements are relatively insensitive to logic gate switching points and interconnect wire capacitance. As well, the smallest delay increments are less than a single gate delay to allow small step changes, i.e., less than 1%, in the frequency. The total delay around the ring oscillator 1200 can be minimized to allow high frequencies to be achieved.

The minimum ring size of the ring oscillator 1200 is three inverting logic gates. While the ring oscillator 1200 achieves the high oscillation frequency obtainable using only three inverting gates, the ring oscillator 1200 may have many more delay stages to allow an arbitrary number of bits of resolution. Such delay stages may be those which provide delay steps equal to or more than the delay of one logic gate.

The number of control bits for the ring oscillator 1220 is not limited to the number of delay stage in the shortest delay path, as is the ring oscillator 1200 of FIG. 12A.

The present invention does not use a tapped delay line, nor does it require or use a Gray code, nor would it require synchronization to the individual taps of the ring oscillator if the oscillator were constructed using a tapped delay line.

The present invention allows provision of a clock signal generator whose output frequency will remain within 1% or 2% of a programmed frequency. For example, the nominal output frequency, for a 0.6 micron CMOS process can be 100 MHz at any temperature or power supply voltage within the operating range of typical ICs. Typical variations in manufacturing process when combined with temperature and supply voltage variations can cause a factor of two increase or decrease in the output frequency (i.e., +100% or −50%) of an uncompensated ring oscillator. Therefore, the output frequency range under nominal conditions is capable of being varied over a similar range (i.e. 50 to 200 MHz, for the 0.6 micron CMOS example). To enable the output frequency to be set within 1% or 2% of the desired frequency, the delay line in the ring oscillator of this invention has sufficiently small delay steps without adding too much fixed delay which would limit the maximum frequency. The small delay steps are relatively insensitive to mismatch in wire capacitance and switching point voltage, to ensure that the desired delay step size is achieved when automatic logic synthesis and layout are employed.

The ratio of consecutive delay stages is preferably designed to be less than than of the next consecutive delay stages by a factor of two, so that there will be no gaps in the frequency range.

The resultant predictability of the relative delay increments facilitates use of a conventional binary search algorithm to find the correct delay line program setting. A binary search is a maximum speed search algorithm that can be implemented with a minimal amount of digital control circuitry.

Figure 3:
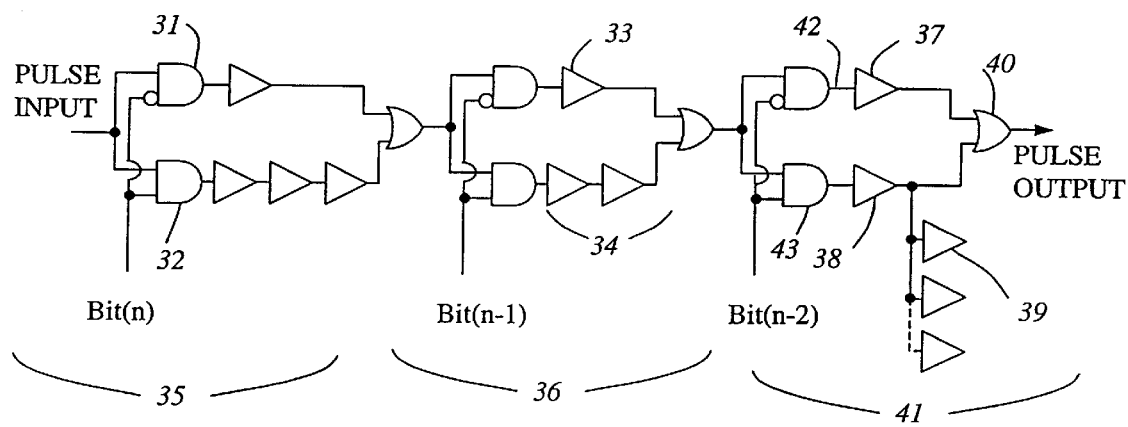
FIG. 3 is a schematic diagram of a programmable delay line of the prior art.
Figure 4:
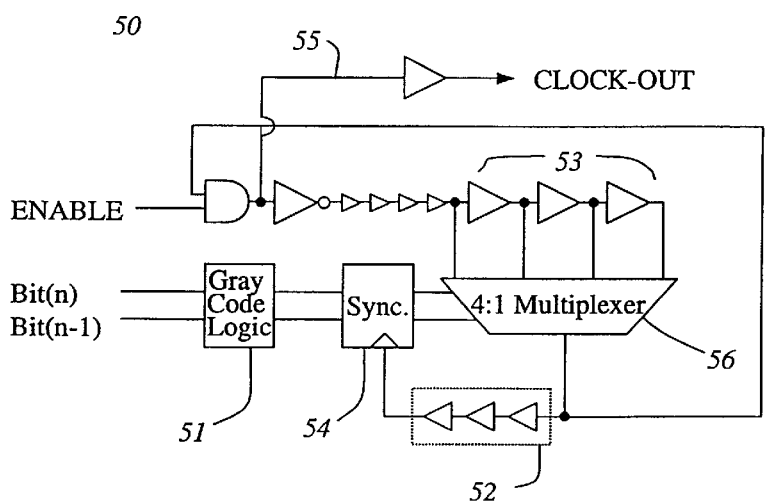
FIG. 4 is a schematic diagram of a glitchless programmable ring oscillator of the prior art.
Figure 5:
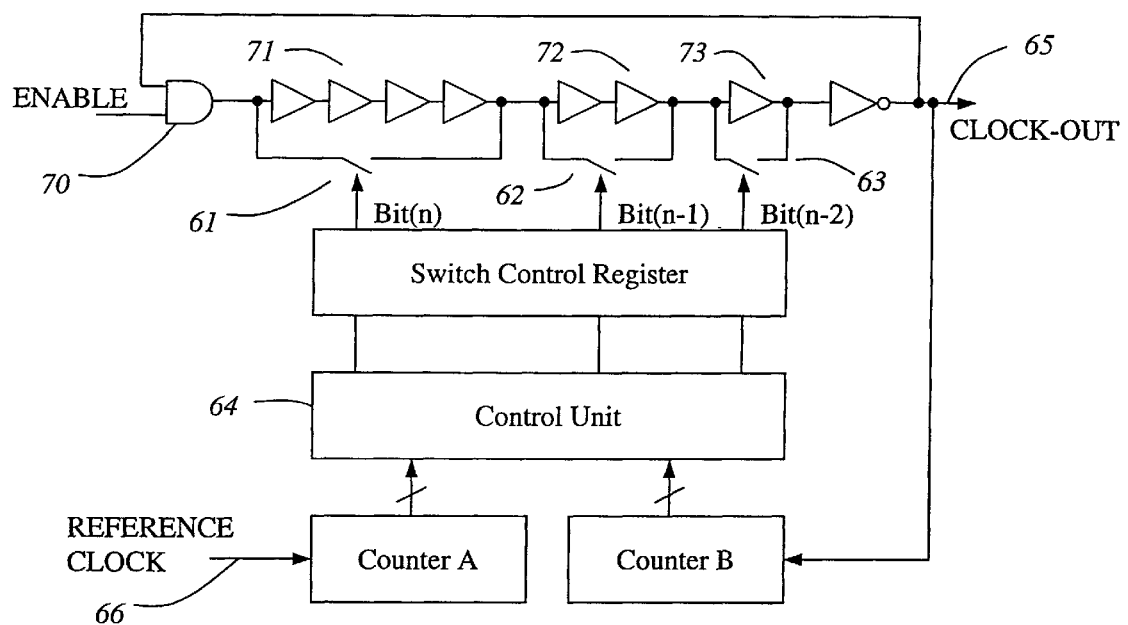
FIG. 5 is a schematic diagram of a frequency-controlled ring oscillator of the prior art.
Figure 6A:
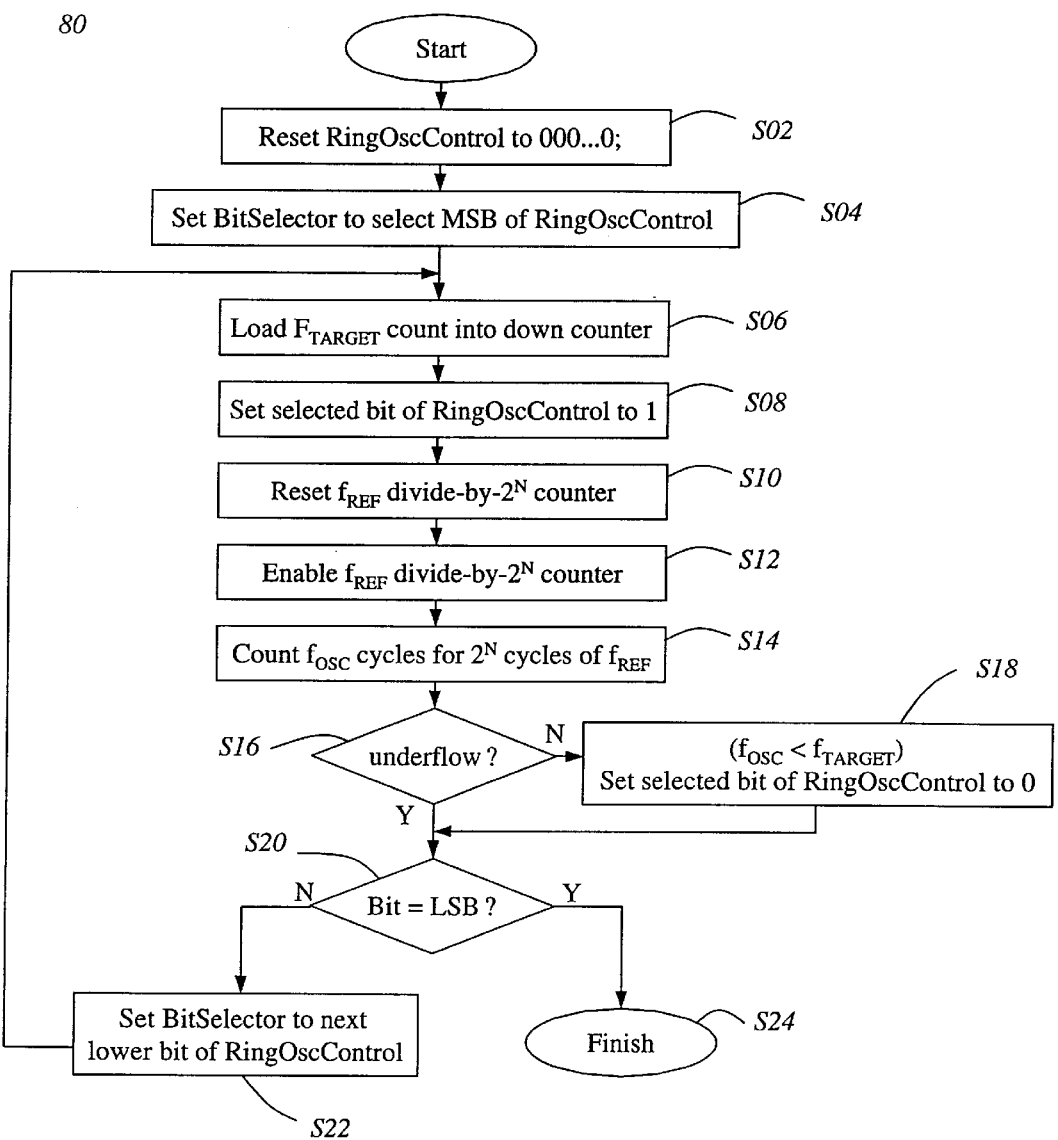
FIG. 6A is a flow diagram of an oscillator calibration process using a conventional binary search.
Figure 6B:
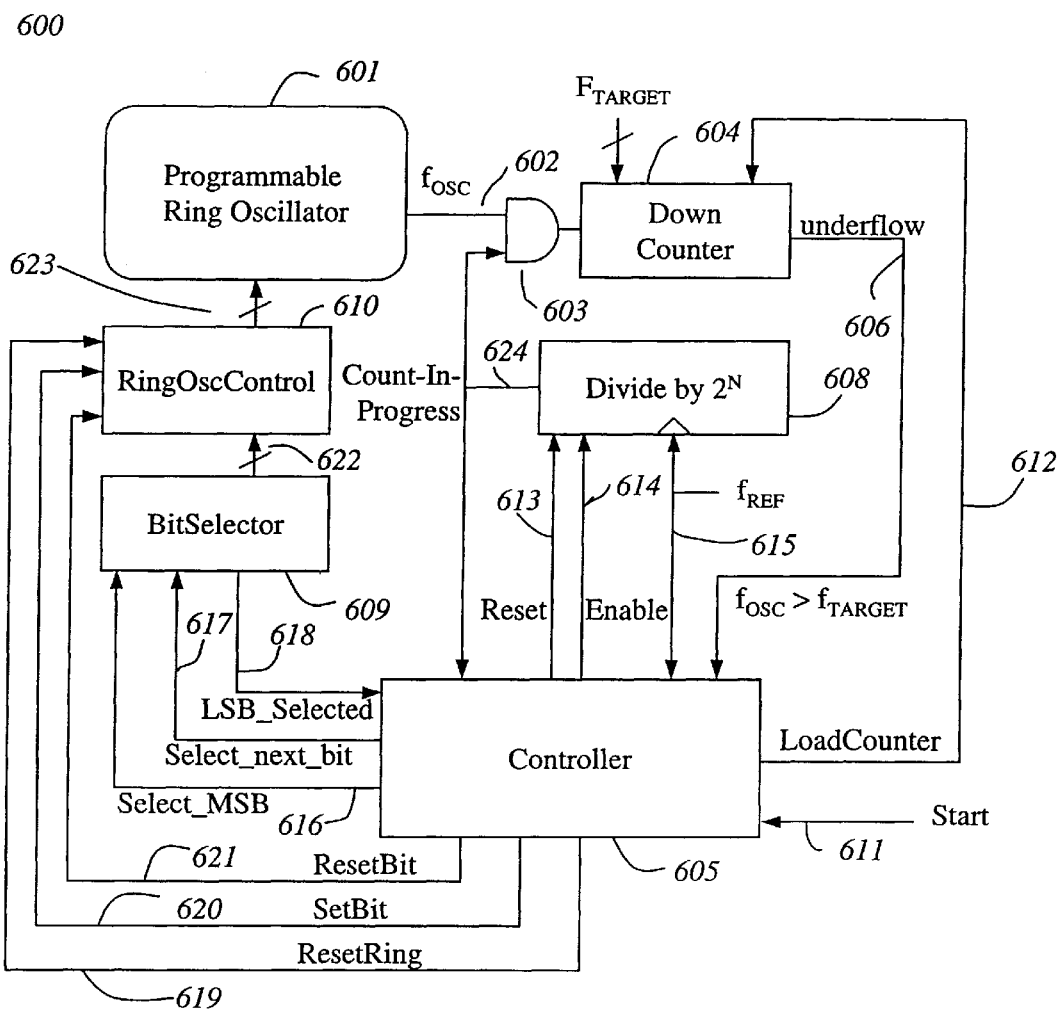
FIG. 6B is a circuit block diagram of an oscillator whose output frequency is calibrated using a binary search.

With an example binary search algorithm whose flow diagram 80 is shown in FIG. 6A, and whose example circuit block diagram 600 is shown in FIG. 6B, the frequency of the ring oscillator unit 900 or any other ring oscillators may be calibrated in minimal time. The detailed flow of a binary search is well-known, and there are many implementations, so the details of FIG. 6A and FIG. 6B are presented as an example of the prior art only.

In FIG. 6B, a programmable ring oscillator 601 generates a clock signal 602 with frequency $f_{OSC}$. The clock signal 602 is input through an And gate 603 to a down counter 604 which receives a target count $F_{TARGET}$ and generates an under flow signal 606 to a controller 605. The controller 605 is also connected to a divide-by-$2^N$ counter 608, a bit selector 609 and a ring oscillator control 610. The controller 605 receives a start signal 611 and generates a load counter signal 612 to the down counter 604, reset and enable signals 613, 614 and a reference frequency $f_{REF}$ 615 to the divide-by-$2^N$ counter 608, bit select signals Select_MSB 616 and Select_next_bit 617 to the bit selector 609, and a ResetRing signal 619 and SetBit and ResetBit signals 620, 621 to the ring oscillator control 610. The bit selector 609 send a LSB_Selected signal 618 to the controller 605. The output signal 622 of the bit selector 609 is input to the ring oscillator control 610, whose output signal 623 is input to the ring oscillator 601. The output signal of the divide-by-$2^N$ counter 608 is input to the controller 605 and the And gate 603.

As shown in FIG. 6A, the binary search starts by resetting the ring oscillator control 610 to "000 . . . 0" (S02), and setting the bit selector 609 to select a Most Significant Bit (MSB) of the ring oscillator control 610 (04). The target count $F_{TARGET}$ is loaded into the down counter 604 (06). The selected bit of the ring oscillator control 610 is set to 1(S08). The divide-by-$2^N$ counter 608 is reset (S10) and enable (S12). Then, the cycles of the output frequency $f_{OSC}$ of the ring oscillator 601 are counted for $2^N$ cycles of the reference frequency $f_{REF}$ (S14). If the count result is not under flow (S16), i.e. $f_{OSC}<f_{TARGET}$, the selected bit of the ring oscillator control 610 is set to 0(S18). After this step or when the count result is under flow (S16), the selected bit is checked if it is a Least Significant Bit (LSB) (S20). If it is not the LSB, the bit selector 609 is selected to the next lower bit of the ring oscillator control 610 (S22) and returns to step S06. If the selected bit is the LSB (S20), then the binary search is finished (S24).

IMPLEMENTING DELAY STEPS LESS THAN THE DELAY OF ONE LOGIC GATE

Figure 7A:
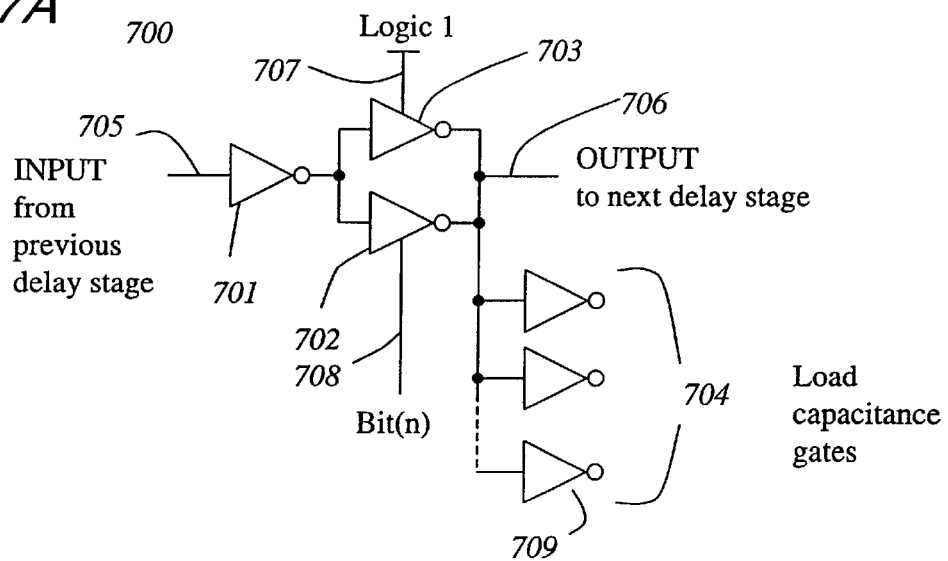
FIG. 7A is a schematic diagram of a circuit which achieves small delay increments according to an embodiment of the invention.
Figure 7B:
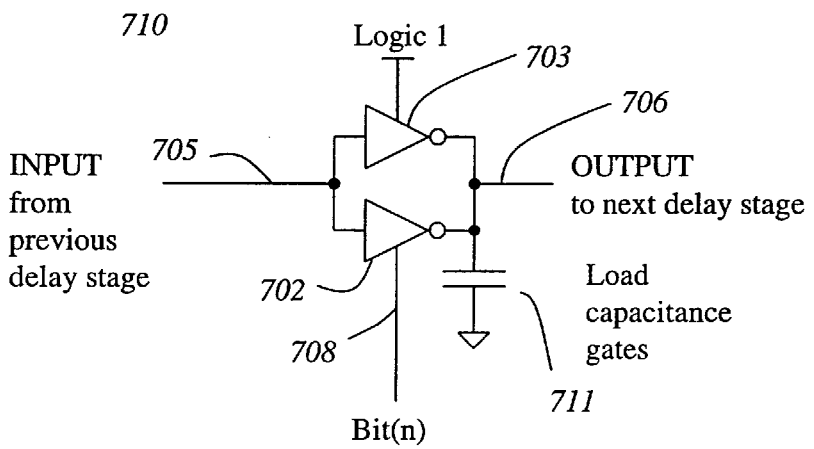
FIG. 7B is a schematic diagram of a circuit which achieve small delay increments employing a minimal number of inverting logic gates according to an embodiment of the invention.
Figure 7C:
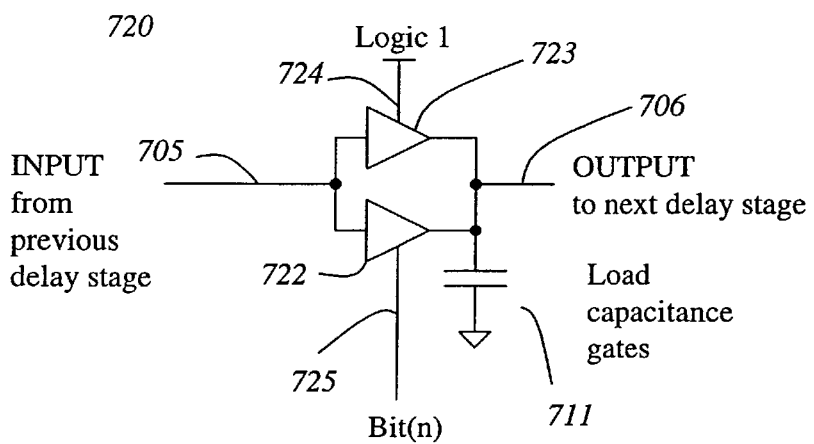
FIG. 7C is a schematic diagram of a circuit which achieves small delay increments employing non-inverting logic gates according to an embodiment of the invention.

Referring FIG. 7A, FIG. 7B and FIG. 7C, example delay stages 700, 710, and 720 of the delay stage 1210a shown in FIG. 12C which implements delay steps less than the delay of a non-inverting logic gate are described. Each of delay stages 700, 710, and 720 contains two 3-state buffers of equal drive, connected in parallel. The 3-state buffers may be inverting or non-inverting logic gates.

The delay stage 700 shown in FIG. 7A uses two 3-stage inverting logic gates 702 and 703 of same design, connected in parallel between an input 705 and an output 706. The input 705 receives a signal from a previous delay stage. The output 706 provides a signal to the next delay stage. The inverter 703 receives a control bit 707, logic 1. The inverter 702 receives a control bit 708, Bit(n).

The delay stage 700 has a series inverter 701 which serves to provide a single switching point and to minimize any capacitive feedback, e.g., Miller capacitance, between the output 706 and the input 705 of the delay stage 700.

The delay stage 700 is also provided with a load capacitance unit 704 connected to the output of the inverters 702, 703. The load capacitance unit 704 comprises a plurality of parallel load capacitive gates 709. The load capacitance unit 704 serves to increase the capacitance on the output 706.

In operation, the control bit 707 of the inverter 703 is maintained to logic 1. Thus, the inverter 703 is always enabled during the operation. To decrease the delay, the control bit 708 of the inverter 702 is changed form logic 0 to logic 1 to enable the inverter 702, thus doubling the drive of the parallel gates 702 and 703. The decrease in delay is approximately equal to the change in the output impedance of the parallel gate 702 and 703 times the load capacitance of the unit 704.

The delay stage 710 shown in FIG. 7B also uses two 3-state inverting logic gates 702 and 703 of same design, connected in parallel between an input 705 and an output 706, similarly to those shown in FIG. 7A. The delay stage 710 has a load capacitance unit 711 which is shown symbolically as a simple capacitor. The capacitance may be implemented using load capacitance gates 704 as shown in FIG. 7A.

The delay stage 720 shown in FIG. 7C is similar to the delay stage 710 shown in FIG. 7B, but the stage 720 uses two 3-state non-inverting logic gates 722 and 723. Similarly to the inverting gates 702 and 703 of FIG. 7B, the non-inverting gate 723 of FIG. 7C receives a control bit 724, which is logic 1 during the operation. The non-inverting gate 722 receives a control signal 725, Bit(n), which takes a value of logic 0 or logic 1.

Figure 7D:
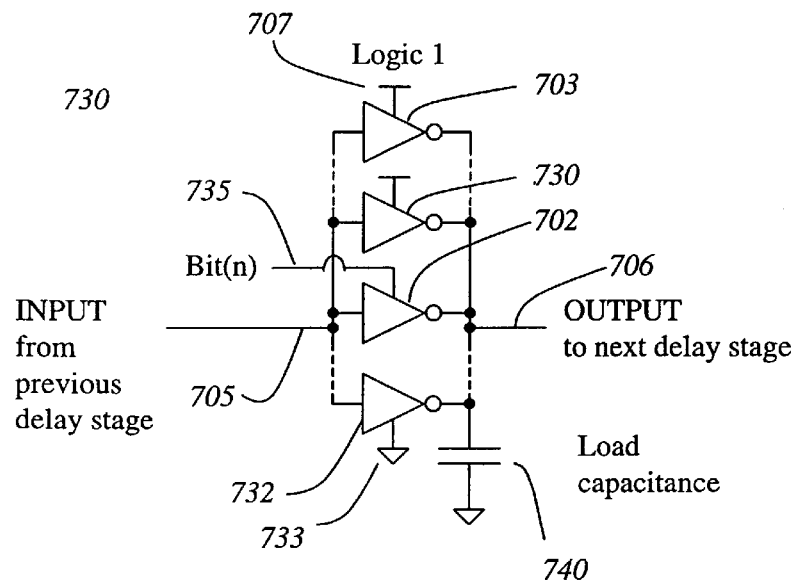
FIG. 7D is a schematic diagram of another circuit which achieves small delay increments employing inverting logic gates according to an embodiment of the invention.

The delay stage 730 shown in FIG. 7D extends the principle used in FIGS. 7A, 7B, and 7C. Additional gates 730 which are continuously enabled by a control bit 707 may be connected in parallel with gate 703 to reduce the delay increment when Bit(n) 735 is enabled.

Figure 8A:
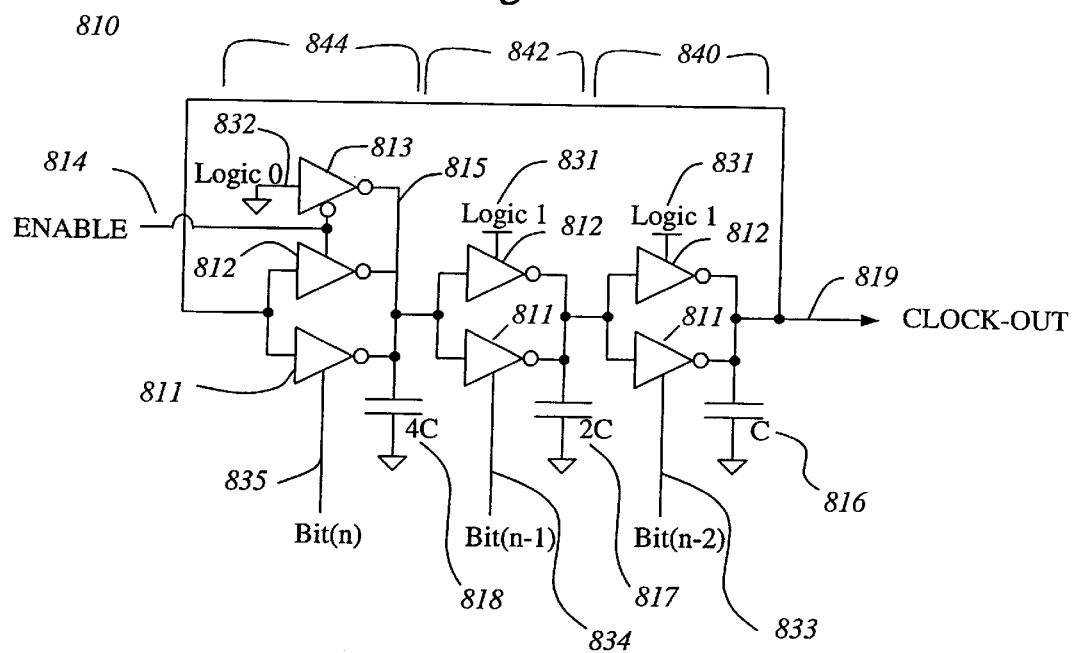
FIG. 8A is a schematic diagram of a maximum frequency, programmable ring oscillator according to an embodiment of the invention.
Figure 8B:
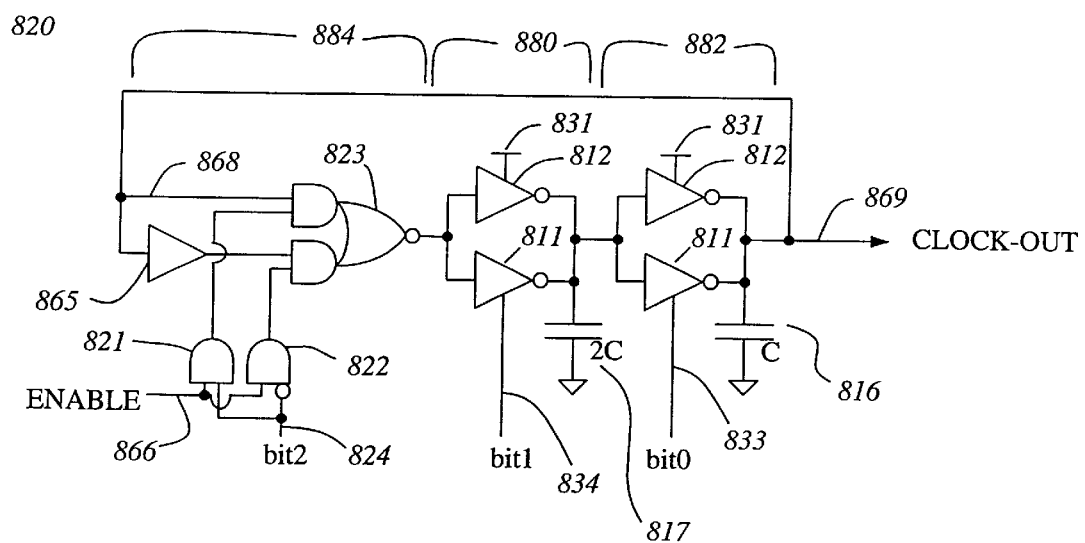
FIG. 8B is a schematic diagram of an alternative, maximum frequency, programmable ring oscillator according to an embodiment of the invention.
Figure 8C:
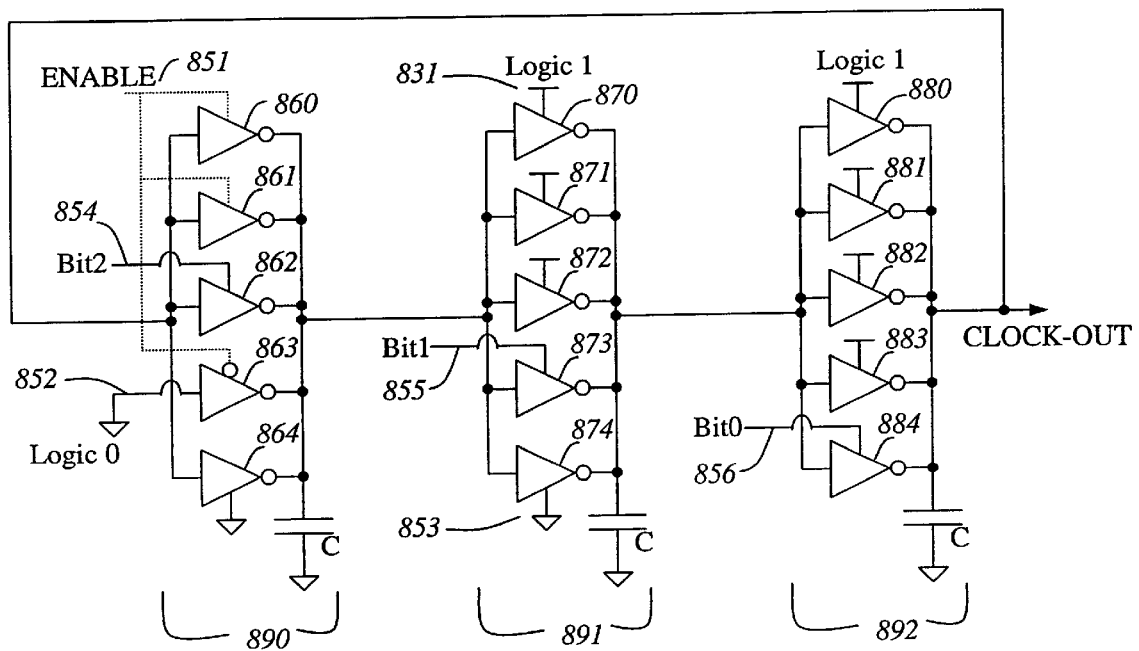
FIG. 8C is a schematic diagram of an alternative, maximum frequency, programmable ring oscillator according to an embodiment of the invention.

For example, the parallel drive will increase by 50% when three drivers are enabled, relative to two drivers enabled. The drive will increased by 33% when four are enabled, relative to three enabled. The drive will increase by 25% when five are enabled, relative to four enabled. These cases are shown in FIG. 8C which shows a ring oscillator 850 comprising three delay stages 890–892. In delay stage 890, two parallel gates 860 and 861 are enabled by an enable signal 851. In delay stage 891, three parallel gates 870–872 are enabled by a logic 1 signal 831. In delay stage 892, four parallel gates 880–883 are enabled. Gates 862, 873, 884, one in each delay stage, are controlled by frequency control bits 854, 855, 856, respectively.

Referring back to FIG. 7D, additional gates 732 which are disabled by control bit 733 may also be connected in parallel with gate 702 to add load capacitance. Load capacitance also exists in the form of interconnect wiring or additional logic gate inputs, and is shown symbolically as a capacitor 740.

Figure 7E:
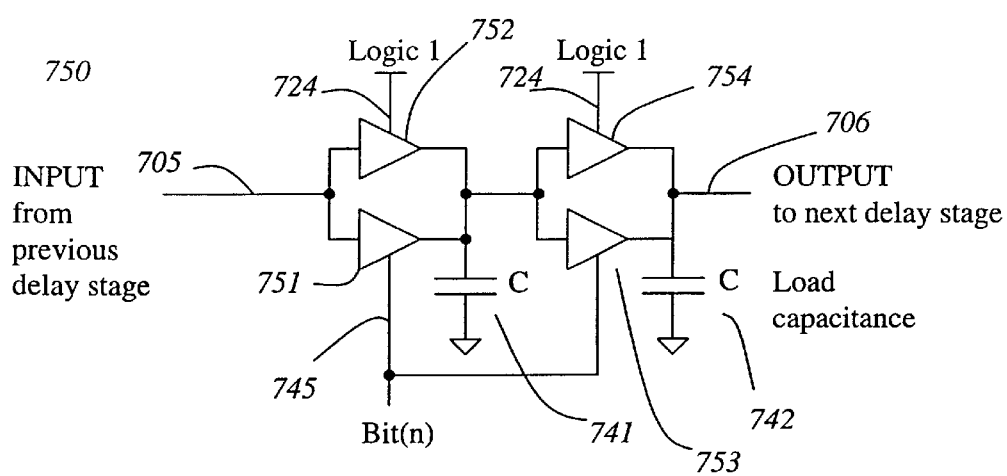
FIG. 7E is a schematic diagram of another circuit which achieves small delay increments employing non-inverting logic gates according to an embodiment of the invention.

The delay stage 750 shown in FIG. 7E comprises two of the delay stages in FIGS. 7A, 7B, 7C, or 7D, both controlled by a single bit control line 745. Parallel gates in these delay sages are symbolically shown as gates 751–754, and the load capacitances are symbolically shown as capacitors 741, 742.

In the above examples, a pair of 3-state logic gates is used in each delay stage. However, the logic gates 703 and 723 may be a 2-state logic gate or a different type of logic gate. In that case, its delay needs to be well-matched to that of the other logic gate in the delay stage. Using logic gates of identical design is performed.

To achieve a target delay increment for a delay stage, the 3-stage logic gate in the logic cell library with the least drive, i.e., the highest output impedance, is preferably used. Sufficient load capacitance gates are connected to the output of the logic gate until the calculated change in delay is correct, knowing the input capacitance of each logic gate and the typical wire capacitance. If the correct number of load capacitance gates is less than one or less than two, then another parallel 3-state logic gate (not shown) may be added and selectively enabled, but this is seldom necessary.

The delay stages 700, 710, 720, 730 shown in FIGS 7A, 7B, 7C, 7D rely on switching point matching, but he switching points are inherently well matched because a single input is connected to parallel logic gates of the same design, and the gates are connected to the same output 706. Bypass switches are not used; instead, the output drive within a delay stage is changed.

These delay stages 700, 710, 720, 730 are inherently glitch-free, and can be switched at any time. The invention may use other means, described later, to prevent delay stages with larger delays form delivering glitches. It is possible, and practical, to implement longer delays in a delay stage by connecting in series more than one of the delay stages 700, 710, 720 or 730, with all delays being enabled or disabled by a common bit line, as shown in FIG. 7E. These delay stages will be inherently glitchless.

To deliver maximum frequency by using a programmable ring oscillator, the ring oscillator comprises no more than three inverting delay stages, as previously discussed. Example programmable ring oscillators 810 and 820 are shown in FIG. 8A and FIG. 8B, respectively. Programmable ring oscillators which generate less than the maximum frequency may contain more than three delay stages, and might not contain any delay stages having less than a single gate delay step.

The ring oscillator circuit 810 shown in FIG. 8A comprises three delay stages 840, 842 and 844, which are similar to that shown in FIG. 7B. Each delay stage 840, 842, 844 comprises two inverting logic gates 811 and 812, and a load capacitance unit 816, 817, 818, respectively. The gates 812 of the delay stages 840 and 842 receive a control bit 831 whose value is logic 1 during the operation of the oscillator 810. The gate 812 of the delay stage 844 receives an enable signal 814. The gates 811 of the delay stages 840, 842, 844 receive control bits 833, 834, 835 whose values are Bitn-2), Bit(n-1) and Bit(n), respectively.

The delay stage 844 is also provided with a reset/enable function comprising a reset-control 3-state inverting logic gate 813. The reset-control inverter 813 receives an input signal 832 whose value is logic 0. The reset-control inverter 813 also receives a control signal which is an inverted enable signal 814.

In operation, when the ring oscillator 810 is reset, the enable signal 814 is logic 0 which disables the oscillation inverter 812 of the delay stage 844 and enables the reset-control inverter 813. As the input of the reset-control inverter 813 is logic 0, the enabling of the reset-control inverter 813 drives the output signal 815 to a constant logic 1.

The use of the reset-control 3-state inverter 813 performs the reset/enable function without reducing the number of programmable delay stages in the ring oscillator 810. By contrast, using a conventional gate like the gate 81 seen in FIG. 1 in the ring oscillator 810 would reduce the number of programmable delay stages from three to two.

An alternative implementation of the enable/reset function is included in the ring oscillator circuit 820 shown in FIG. 8B. The ring oscillator 820 has two delay stages 880 and 882 similar to the delay stages 840, 842 shown in FIG. 8A, and a delay stage 884 which provides an enable/reset function.

The delay stage 884 uses an And-Or-Invert logic gate 823, two And gates 821, 822 and a non-inverting gate 865. The And gates 821, 822 receive a control signal 824, bit2, and an enable signal 866. The outputs of the And gates 821, 82 are input to the And-Or-Invert logic gate 823. The And-Or-Invert logic gate 823 also receives the output 869 of the delay stage 880 directly at one And gate and through the non-inverting gate 865 at the other And gate.

In operation, when the enable signal 866 is logic 0, the outputs of the And gates 821 and 822 are also logic 0, which forces the output of the And-Or-Invert logic gate 823 to logic 1. The And gates 821 and 822 serve to prevent decoding glitches at the output of the And-Or-Invert logic gate 823 from occurring when the enable signal 866 rises to logic 1. When the enable signal 866 is logic 1, one of the two input delay paths 868, 869 to the And-Or-Invert logic gate 823 is selected according to the control bit 824.

In the ring oscillator circuits 810 and 820, the load capacitance units 816, 817, 818 comprise logic gates, and are illustrated symbolically as capacitors 4C (818), 2C (817) and C (816). The capacitors 4C and 2C have four times and twice the capacitance of the capacitor C, respectively. In other words, if 20 logic gate inputs are connected in parallel to achieve a half gate delay variation in the stage with 4C, then 10 logic gate inputs are connected in parallel to implement 2C, and 5 logic gate inputs are connected in parallel to implement C. These numbers are approximate, because wire capacitance will cause a deviation from these values.

Another ring oscillator implementation is shown in FIG. 8C, and it employs the circuit 730 of FIG. 7D. It also employs the reset technique illustrated in FIG. 8A. The three delay stages 890–892 differ in the number of inverters which are continuously enabled, and the number which are continuously disabled.

The number of inverters which are continuously enabled, is increased in the less significant bit delay sages, as previously described for FIG. 7D.

In delay stage 890, two inverters 863, 864 are continuously disabled. A gate 862 receives a control signal Bit2 854. In delay stage 891, an inverter 874 is continuously disabled. A gate 873 receives a control signal Bit1 855. In delay stage 892, no inverter is continuously disabled. A gate 884 receives a control signal Bit0 856.

Inverters which are continuously disabled, are connected solely to add load capacitance so that each of the delay stage 890, 891, and 892, has approximately the same output capacitance.

The structure of FIG. 8C does not require binary ratios between the load capacitances, as is required for the circuits of FIGS. 8A and 8B. Again, the load capacitances need only be approximate because the drive increment for each stage decreases by less than a factor of 2 relative to the more significant bit delay stage.

The frequency range of the minimum-sized ring oscillators 810 and 820 is typically not very large because they each have only seven small frequency steps (the number of steps between any N values is N-1).

USING A GROUP OF RING OSCILLATORS TO INCREASE FREQUENCY RANGE

It is preferable to use a group of ring oscillators as a ring oscillator unit to increase frequency range. Each ring oscillator is designed to have a different frequency range. As long as each ring oscillator's frequency range slightly overlaps that of the ring oscillator which has the next higher frequency range, then a continuous range of frequencies can be generated.

Figure 9A:
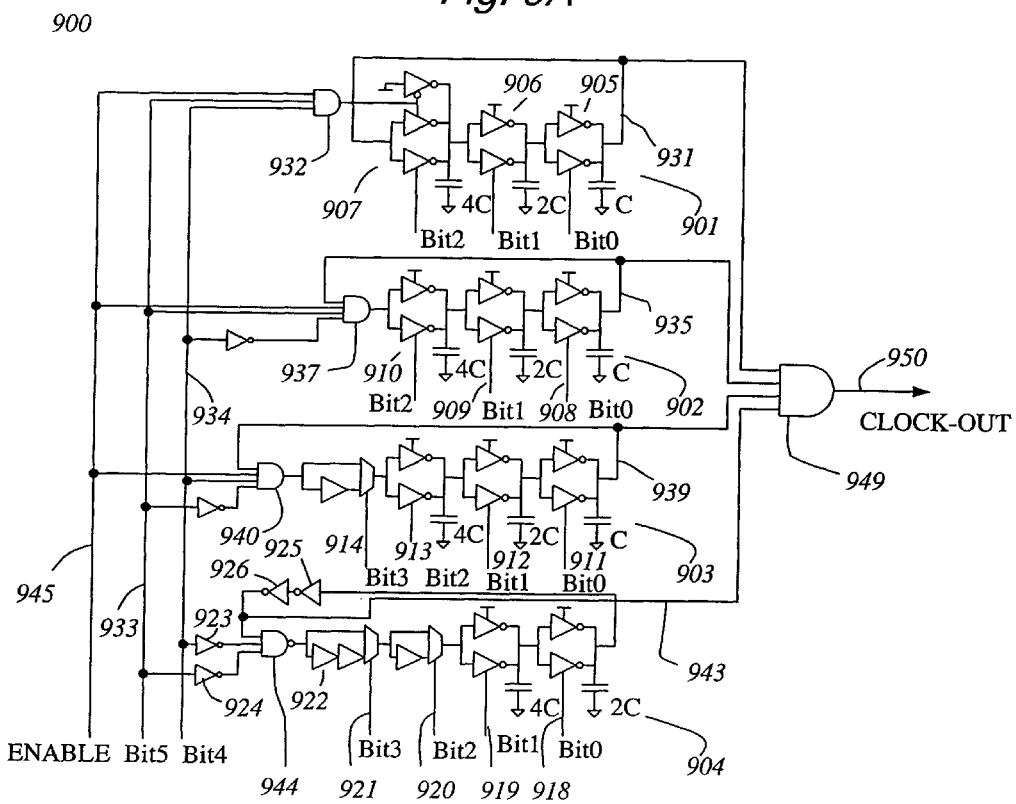
FIG. 9A is a schematic diagram of a plurality of a ring oscillators designed to provide a wide range of frequencies with arbitrary accuracy, and means to access one of the oscillator output signals according to an embodiment of the invention.

An embodiment of such a ring oscillator unit 900 is shown in FIG. 9A. In this unit 900, the frequency range is increased by connecting four programmable ring oscillators 901–904 to a single output 950, and accessing only one of the ring oscillators 901–904 whose frequency rang includes a desired output frequency. When a different ring oscillator needs to be accessed, the currently active ring oscillator is disconnected or temporarily reset/disabled, and the different ring oscillator is simultaneously enabled. As will be described later, the disconnecting is preferably performed synchronously with the output clock to ensure a glitchless frequency change.

The ring oscillator 901 is similar to that shown in FIG. 8A, and has three programmable delay stages 905–907 receiving control signals Bit0, Bit 1 and Bit2, respectively. The ring oscillator 901 also has an And gate 932 which receives control signals Bit4, Bit5 on lines 933, 934, and ENABLE on line 945. The output of the And gate 932 is fed to the enable input of the delay stage 907. The ring oscillator 901 output an internal clock signal 931.

The ring oscillator 902 has three programmable delay stages 908–910, which are similar to those of the oscillator 901, except for the reset/enable function. Instead of using the reset-control 3-state inverter in the delay stage 907 of the ring oscillator 901, the ring oscillator 902 uses an And gate 937 which receives the control signals Bit5 and ENABLE directly, and the control signal Bit4 through an inverter 938. The And gate 937 also receives an internal clock signal 935 output from the delay stage 908. The output of the And gate 937 is input to the delay stage 910.

The ring oscillator 903 comprises four programmable delay stages 911–914, an inverter 917 and an And gate 940. The And gate 940 receives the control signals Bit4 and ENABLE directly, and the control signal Bit5 through the inverter 917. The And gate 940 also receives an internal clock signal 939 output form the delay stage 911. The output of the And gate 940 is input to the delay stage 914. The delay stage 914 comprises a non-inverting gate 915 and a multiplexer 916 which receives a control signal Bit3. The output of the multiplexer 916 is input to the delay stage 913. The delay stages 911–913 are similar to the delay stages 908–910 of the ring oscillator 902.

The ring oscillator 904 comprises four programmable delay stages 918–921, inverters 923, 924, a Nand gate 944 and series inverters 925, 926. The delay stages 918, 919 are similar to the delay stages 912, 913 of the ring oscillator 903. The output of the delay stage 918 is input to the series inverters 925, 926 provided to generate an internal clock signal 943. The internal clock signal 943 is input to the Nand gate 944, which also receives the control signal ENABLE directly, and the control signals Bit4 and Bit5 through the inverters 923, 924, respectively. The output of the Nand gate 944 is input to the delay stage 921, whose output is in turn input to the delay stage 920. The delay stages 920, 921 are similar to the delay stage 914 of the ring oscillator 903, but the delay stage 921 has an extra non-inverting gate 922.

The internal clock signals 931, 935, 939, 943 of the ring oscillators 901–904 are input to the And gate 949 which outputs a main clock signal CLOCK-OUT 950.

Each ring oscillator 901–904 is designed to have a different frequency range. The ring oscillator 901 has the highest frequency output 31 because it contains only three delay stages 905–907. It is enabled when the control signals Bit4 and Bit5 on lines 933 and 934 to the And gate 932 are both logic 1, which disables the other three ring oscillators 902–904 and forces their outputs 935, 939 and 943 to a constant logic 1. The ring oscillator 904 has the lowest frequency output 943 because it contains the most logic gates. The ring oscillator 904 has a minimum of 9 and a maximum of 15 inverting logic gates in series (a non-inverting gate comprises two inverting logic gates). It is enabled when the control signals Bit4 and Bit5 on lines 933 and 934 to Nand gate 944 are both logic 0, which also disables the other three ring oscillators 901–903. The CLOCK-OUT output 950 from the And gate 949 is therefore always equivalent to the output form the selected ring oscillator.

The control bits Bit0, Bit1, . . . , Bit5 can be adjusted using a binary search algorithm, such as shown in FIG. 6, with Bit5 being the most significant bit (MSB) and Bit 0 being the least significant bit (LSB) in this example circuit. The control bits do not need to be connected to every ring oscillator, as some oscillators have fewer stages. This has no impact on a binary search because changing any single control bit form logic 0 to logic 1 always produces a higher frequency or no change in frequency.

Figure 9B:
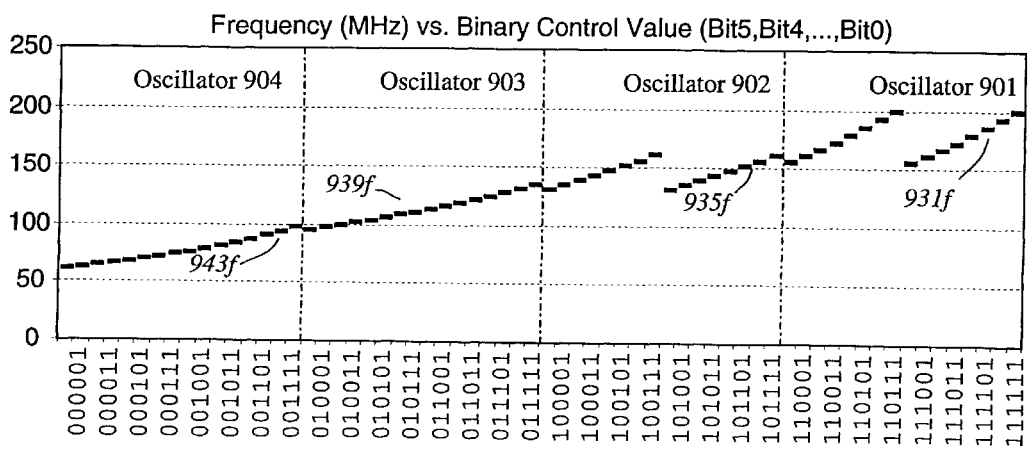
FIG. 9B is a graph showing an example relationship between the output oscillation frequency and the binary control bits, for the embodiment of the invention shown in FIG. 9A.

FIG. 9B graphically illustrates the relationship between frequency and control bits Bit0, Bit1, . . . , Bit5 for the ring oscillator unit 900 in FIG. 9A. The four overlapping frequency ranges 931f, 935f, 939f and 943f of each ring oscillator 901–904, respectively, are delineated in the graph. Oscillators 901 and 902 only have three control bits, so their frequencies repeat for Bit3 equal to 0 and 1. Each ring oscillator addresses a different frequency range because each ring contains a different minimum number of delay elements. In the graph in FIG. 9B, for a 0.6 micron CMOS example, with 400 ps delay for a non-inverting gate, the frequency steps are not larger than 4%, so the output frequency can always be set to a value within 2% of the target frequency.

The arrangement like the ring oscillator unit 900, wherein a plurality of ring oscillators is connected to a single output, allows maximum frequency range, from the maximum frequency possible in a given technology down to the minimum frequency that is economically feasible, as determined by the maximum number of delay stages that can be integrated. This can be accomplished with arbitrary accuracy because each ring oscillator can cover as narrow a range of frequencies as necessary. To create a ring oscillator with the next lower frequency range, additional delay stages are added which may be programmable or non-programmable. When the delay to be added is less than that of a programmable stage, a single logic gate can be added, or extra load capacitance gates can be added, or both can be added, inside the ring of the oscillator.

Using a frequency measurement unit such as the one include din FIG. 6B, the time required to re-calibrate the output frequency of an oscillator can be calculated as follows:

$Tcal = m \times 2^N / f_{REF}$, where Tcal is the calibration time, M is the number of passes through the binary search algorithm (i.e., number of frequency control bits), $f_{REF}$ is the reference clock frequency, and N is the number of divide-by-2 stages in the $f_{REF}$ clock divider.

The resolution of the measurement is $f_{REF}/2^N$.

To prevent counter overflow, the maximum frequency to be measured needs to be less than $2^{M-N}$.

For example, if $f_{REF}$ is 10 MHz, 4 stages of divide-by-2 (equals divide by 16) are used, and 8 bits of resolution are required, the resolution will be +/−0.6 MHz, the calibration time will be 13 microseconds, and the maximum oscillation frequency that can be measure without overflow is 160 MHz.

Therefore, for the above example, a nominally 100 MHz ring oscillator output can be measured and updated every 13 microseconds to maintain it final output frequency within 1.2% (0.6 MHz measurement resolution+0.6 MHz control resoltuion=1.2 MHz).

In the above example, however, the output frequency changes in progressively smaller steps while the binary search is in progress. It is preferable to prevent these changes from occurring in the clock generator output as these changes may cause glitches which may cause erroneous behavior in the circuit under test. To this end, two options are possible. In one case, the output clock is disabled while calibration is in progress. Such disabling of the output clock is practical in many cases, as the time period in which the output is disabled is typically less than 50 microseconds, e.g. 13 microseconds in the above example. An alternative arrangement is used of a duplicate group of ring oscillators whose frequency range is approximately the same as the first group of ring oscillators. While one group of ring oscillators is actively generating the clock output, the second group is calibrated, as shown in FIG. 11A and described later. When calibration is complete, the second group is synchronously accessed. In this way the frequency is continuously calibrated and updated without deviating beyond the target accuracy. A glitchless switching mechanism is desirably provided in this arrangement, and it will be described next.

GLITCHLESS CHANGING OF THE OUTPUT CLOCK FREQUENCY

Figure 10A:
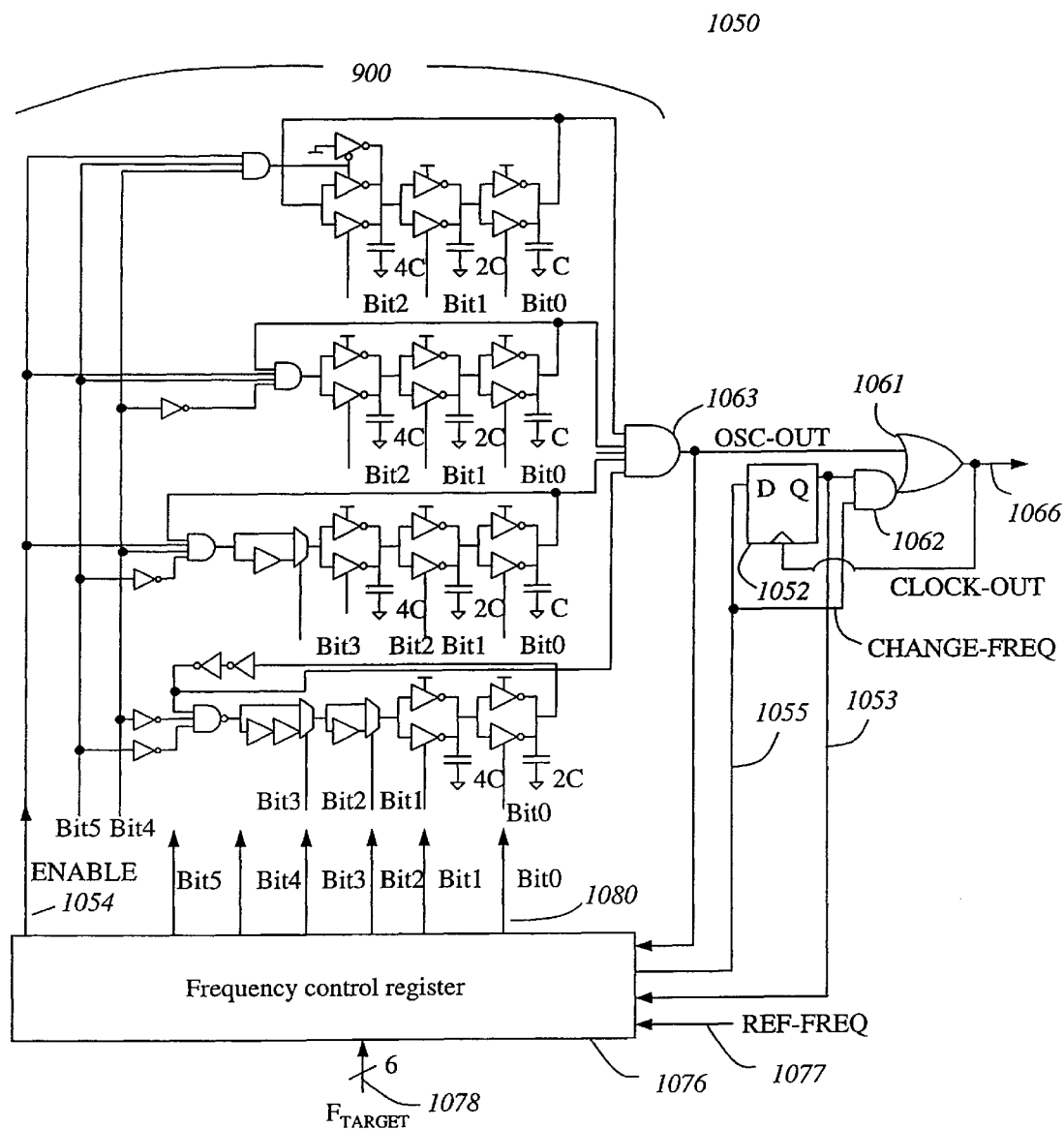
FIG. 10A is a schematic diagram of a circuit for glitchless switching between ring oscillators, according to an embodiment of the invention.
Figure 10B:
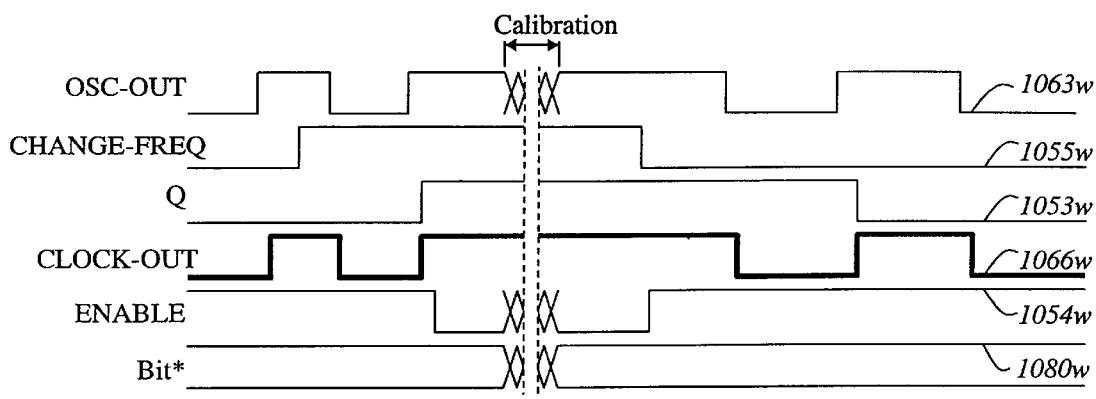
FIG. 10B is a diagram showing the waveforms for the circuit in FIG. 10A.

A general example technique for glitchless frequency changing, according to the present invention, is shown in a programmable clock signal generation circuit 1050 in FIG. 10A, with corresponding circuit waveforms 1063w, 1055w, 1053w, 1066w, 1054w and 1080w in FIG. 10B. The circuit 1050 uses the same example ring oscillator unit 900 shown in FIG. 9A having four ring oscillators. The circuit 1050 also comprises a frequency control register 1076, a D-type flip-flop 1052, an And gate 1062 and an Or gate 1061, and generates a main clock signal output CLOCK-OUT 1066. The unit output signal 1063 of the oscillator unit 900 is input to the frequency control register 1076, which also receives a reference frequency REF-FREQ 1077 and a target count $F_{TARGET}$ 1078, and outputs control bits Bit0–Bit5 1080 and ENABLE 1054. The frequency control register 1076 also generates a change signal CHANGE_FREQ 1055 to a data input D of the flip-flop 1052 and to the And gate 1062. The output Q 1053 of the flip-flop 1052 is input to the And gate 1062 and the frequency control register 1076. The flip-flop 1052 is clocked by the main clock signal CLOCK-OUT 1066. The Or gate 1061 receives the output of the And gate 1062 and the unit output 1063 of the oscillator unit 900, and generates the main clock signal CLOCK-OUT 1066.

Figure 13:
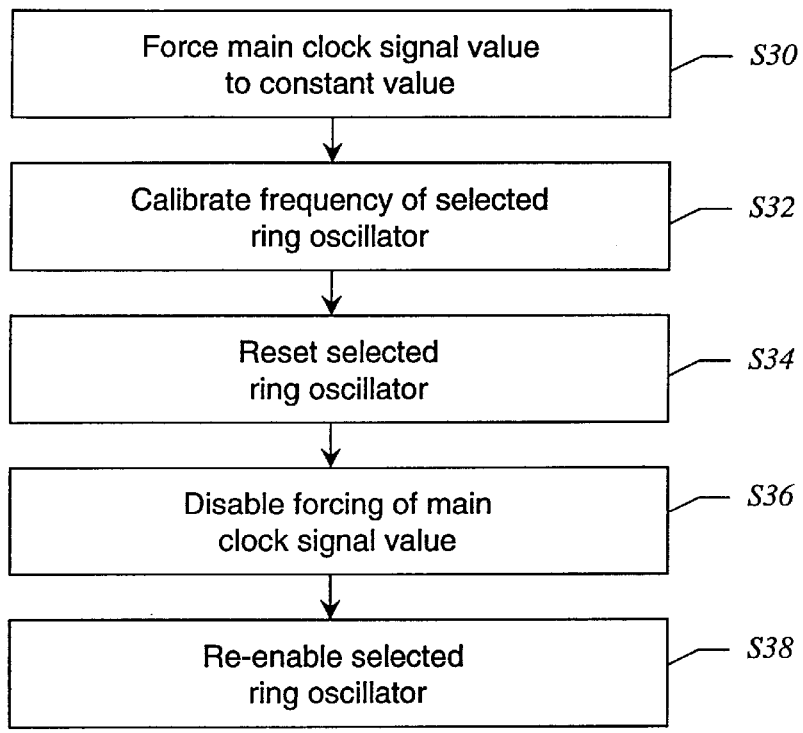
FIG. 13 is a flow diagram showing calibration of the clock signal generation circuit shown in FIG. 12B.

In operation, as shown in FIG. 13, to start calibration of the ring oscillator unit 900, the logic level of the main clock output 1066 is forced to a predetermined constant value following a predetermined edge in the main clock output 1066 (S30). That is, the data input 1055 to the flip-flop 1052 goes to logic 1 when a frequency change is to commence, as determined by the frequency controller 1076. Following the next rising edge of the main clock output 1066, the output of the flip-flop 1052 becomes logic 1, and via logic gates 1062 and 1061, the main clock output 1066 is forced to remain at logic 1. While the ring oscillator is calibrated by the frequency controller logic 1076 (S32), which typically takes less than 50 microseconds as previously discussed, the clock output 1066 remains logic 1. When calibration is complete, the ring oscillators are first reset (S34) by setting the ENABLE line 1054 to logic 0, which makes the unit output signal 1063 of the oscillator unit 900 becomes logic 1. Then, the forcing of the logic level of the main clock output 1066 is disabled (S36) by setting the data input 1055 to logic 0 which makes the output of And gate 1062 logic 0, enabling the OR gate 1061. At the same time, the oscillator enable signal ENABLE 1054 is set to logic 1 to re-initiate oscillation in the addressed ring oscillator (S38), whose output is immediately gated through to the CLOCK-OUT 1066 by the Or gate 1061.

Although four ring oscillators are shown in FIG. 10A, the technique can be applied for any type of ring oscillator, and for any number of ring oscillators connected to a common output.

Another exemplary embodiment of a programmable clock signal generation circuit 1100 containing two programmable ring oscillator units 1101 and 1102 is shown in FIG. 11A along with corresponding circuit node waveforms 1123w, 1124w in FIG. 11B. The circuit 1100 also comprises a unit selector 1150, a frequency measurement unit 1107, a binary research controller 1109 and a unit controller 1160.

The unit selector 1150 comprises Or gates 1121, 1122 for providing unit enable signals ENABLE1, ENABLE2 to the oscillator units 1101, 1102, respectively. The unit selector 1150 also comprises multiplexers 1102, 1104 which selects one of the oscillator unit outputs 1123, 1134 from the oscillator units 1101 or 1102 as a main unit output to generate a main clock signal CLOCK-OUT 1128, and the other unit output as a secondary unit output to generate a secondary clock signal $f_{OSC}$ 1130.

The frequency measurement unit 1107 receives the secondary clock signal $f_{OSC}$ 1130, and compares it with a target count $F_{TARGET}$ 1206 using a reference frequency $f_{REF}$ 1125. The frequency measurement unit 1107 generates a comparison result 1108 to the binary search control 1109. Based on the comparison result 1108, the binary search controller 1109 conducts a binary search and generates control bits Bits* 1120 to the oscillator units 1101, 1102. The binary search controller 1109 also generates a switch signal SwithcOsc 1105 to the unit controller 1160 and to Or gates 1121, 1122.

The unit ocntroller 1160 comprises an Exclusive Or gate 1104 and a D-type flip-flop 1127. The Exclusive Or gate 1104 compares the switch signal 1105 and a control signal 1106 output form the flip-flop 1127 which receives the output of the Exclusive Or gate 1104 and the main clock signal 1128. The control signal 1106 output from the flip-flop flop 1127 controls the Or gates 1121, 1122 and the multiplexers 1103 and 1104 of the unit selector 1150.

Figure 14:
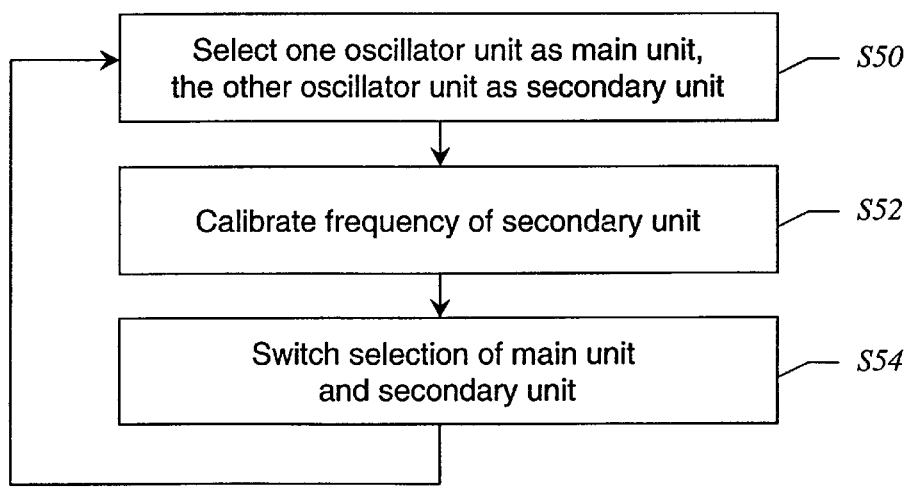
FIG. 14 is a flow diagram showing calibration of the clock signal generation circuit shown in FIG. 11A.

As shown in FIG. 14, the calibration is carried out by selecting one of the oscillator units 1101, 1102 as a main oscillator unit and the other as a secondary oscillator unit (S50), adjusting the programmable frequency of the secondary oscillator unit (S52), and switching the selection between the main oscillator unit and the secondary oscillator unit when the calibration of the secondary oscillator unit is completed (S54).

In the circuit 1100 of FIG. 11A, for the initial state, assume the first ring oscillator unit 1101 is selected by the control signal 1106 which controls multiplexer 1103. While the first ring oscillator unit 1101 is oscillating, a rising edge on the output clock signal 1123 of the oscillator unit 1101 and hence the main clock signal 1128 causes the D-type flip-flop 1127 to latch the value of the switch signal 1105 which indicates that a frequency calibration has been completed for the second ring oscillator unit 1102. When the output 1106 of the flip-flip 1127 becomes logic 1, it accesses and enables the second ring oscillator unit 1102, by driving a logic 0 on the control signal 1106 to the multiplexer 1103 which also disconnects and resets the first ring oscillator unit 1101. Each oscillator unit output 1123, 1124 is designed so that when the ring oscillator unit 1101, 1102 is reset, the output 1123, 1124 of the ring oscillator unit becomes logic 1, and when it is enabled the logic 1 remains in effect unit it has propagated once around the ring of the circuit 1100. Accessing the second ring oscillator unit 1102 causes no glitches because the switching is performed just after the clock output 1128 rises, and the second ring oscillator unit output 1124 is already logic 1; it remains so for approximately half of the new output clock period, as seen in the waveforms 1123w, 1124w, 1105w, 1128w, 1106w, 1121w and 1122w in FIG. 11B.

If the very sight inconsistency cannot be tolerated by the circuit under test, the change over in oscillator units is preferably performed at controlled times, so that the modified clock pulses do not occur when some critically times path is being tested. For example, the calibration may occur during scan operation.

Thus, a glitchless output frequency, in the presence of continuous calibration updates, may be accomplished without need for the precise delay stages or Gray coding used by Chow et al.

USING NON-BINARY DELAY STEP RATIOS

The programmable clock signal generation circuit of the present invention does not rely on an accurate layout and is thus suitable for logic synthesis and automatic layout. To ensure that the output frequency of the circuit can always be programmed to within 1% or 2% of the target frequency, the delay step that can be programmed in each delay stage may be intentionally designed to be less than twice the delay step of the next delay stage. If the variation in actual delay ratios relative to the designed delay ratios is expected to be V%, then the delay ratios are designed to be V% less than two, so that the largest likely ratio in the manufacture depart will be two. For example, if 20% variation in the ratio is expected due to manufacturing processes variations, a ratio of 1.6 is chosen as the design target. For this example, if the delay step of one stage is 8 non-inverting gates, then the delay step in the next shorter delay stage is implemented as 5 non-inverting gates (8/5=1.6), the next shorter delay is implements as 3 non-inverting gates (5/3=1.66), the next as 2, the next as 1, the next as 0.62, etc. This approach clearly requires more delay stages and control bits. For a range that would require N bits if the ratios were all exactly 2, the number of extra bits to tolerate 20% variation in the designed ratio is:

| N          | 4 | 5 | 6 | 7 | 8 | 9 | 10 |
| ---------- | - | - | - | - | - | - | -- |
| Extra bits | 2 | 3 | 3 | 4 | 4 | 5 | 5  |

In general, ExtraBits is approximately equal to [N log 2/log (2-2V)]-N, where N is as defined above, and V is the variation expressed as a position of 1(i.e. V=0.2 for 20% variation).

The clock generation circuitry of the present invention is digital and not sensitive to specific logic delays or layout. The circuit may therefore be described in a Hardware Description Language (HDL), such as Verilog or VHDL, for automatic logic synthesis and layout.

While particular embodiments of the present invention have been shown and described, changes and modifications may be made to such embodiments without departing from the true scope of the invention.

What is claimed is:

1. A programmable clock signal generation circuit for generating a main clock signal, comprising:
    a plurality of programmable ring oscillators, each ring oscillator having multiple delay stages connected in series to form a ring, at least one of the delay stages having programmable delay to produce an internal clock signal with programmable frequency;
    an oscillator selector for selecting the internal clock signal of one of ring oscillators to produce the main clock signal;
    a comparator for comparing the programmable frequency of the selected internal clock signal with a reference frequency to produce a comparison result; and
    a frequency controller for adjusting the programmable frequency of the selected ring oscillator and controlling the oscillator selector to select the internal clock signal of a different one of the ring oscillators, based on eh comparison result.

2. The programmable clock signal generation circuit as claimed in claim 1, wherein the one of the delay stages comprises:
    a delay stage input for receiving a delay stage input signal;
    a delay stage output for outputting a delay stage output signal;
    a first logic gate connected between the delay stage input and the delay stage output, the first logic gate being enabled during operation of the ring oscillator; and
    a second logic gate connected between the delay stage input and the delay stage output in parallel to the first logic gate, the second logic gate receiving a gate enable signal, the second logic gate being disabled to provide the delay stage output signal with a first impedance and a first frequency when the gate enable signal is inactive, and the second logic gate being enabled to provide the delay stage output signal with a second impedance and a second frequency when the gate enable signal is active, so that the second impedance is smaller than the first impedance which causes the second frequency to be greater than the first frequency.

3. The programmable clock signal generation circuit as claimed in claim 2, wherein the first logic gate and the second logic gate are 3-state logic gates of identical design.

4. The programmable clock signal generation circuit as claimed in claim 2, wherein the first logic gate comprises a plurality of logic gate of identical design connected in parallel.

5. The programmable clock signal generation circuit as claimed in claim 2, wherein
    the first logic gate receives an oscillator enabling signal, the first logic gate is enabled when the oscillator enabling signal is active, and the first logic gate is disabled when the oscillator enabling signal is inactive; and
    the one of the delay stages further comprises a reset control logic gate connected between the delay stage input and the delay stage output in parallel to the first logic gate and the second logic gate, the reset control logic gate receiving an inverted signal of the oscillator enabling signal, the reset control logic gate drives the delay stage output signal to a constant value when the oscillator enabling signal is inactive to accomplish a reset function of the ring oscillator.

6. The programmable clock signal generating circuit as claimed in claim 2, wherein the one of the delay stages further comprises a load capacitance unit connected to the delay stage output for providing a capacitance to the one of the delay stages.

7. A method for providing a main clock signal with a target frequency using a clock signal generation circuit having a plurality of programmable ring oscillators, each ring oscillator having multiple delay stages connected in series to form a ring, at least one of the delay stages having programmable delay to produce an internal clock signal with programmable frequency; the method comprising the steps of:
    forcing the logic level of the main clock signal to a predetermined constant value following a predetermined edge in the main clock signal;
    adjusting the programmable frequency of a selected ring oscillator when the selected ring oscillator is capable of generating the target frequency, and selecting the internal clock signal of a different one of said ring oscillators when the different one of said ring oscillators is capable of generating the target frequency;
    resetting the selected ring oscillator so that its internal clock signal becomes the same logic level as the main clock signal;
    disabling said forcing of the logic level of the main clock signal; and re-enabling the selected ring oscillator so that it begins to oscillate and its internal clock signal drives said main clock signal with the target frequency.

8. A programmable clock signal generation circuit for generating a main clock signal, comprising:
   a first oscillator unit having a programmable ring oscillator containing multiple delay stages connected in series to form a ring, at least one of the delay stages having programmable delay to produce an internal clock signal with programmable frequency;
   a second oscillator unit having a programmable ring oscillator containing multiple delay stages connected in series to form a ring, at least on of the delay stages having programmable delay to produce an internal clock signal with programmable frequency;
   a unit selector for selecting one of the first and second oscillator units as a main oscillator unit to produce the main clock signal from the internal clock signal of the main oscillator unit, and selecting the other one of the first and second oscillator units as a secondary oscillator unit to produce a secondary clock signal from the internal clock signal of the secondary oscillator unit;
   a comparator for comparing the programmable frequency of the internal clock signal of the secondary oscillator unit with a reference frequency to produce a comparison result;
   a frequency controller for adjusting the programmable frequency of the internal clock signal of the secondary oscillator unit, based on the comparison result;
   a unit controller for controlling the unit selector to switch the selection between the main oscillator unit and the secondary oscillator unit when frequency adjustment of the secondary oscillator unit is completed.

9. The programmable clock signal generation circuit of claim 8, wherein
   either one of the first oscillator unit and the second oscillator unit has a plurality of ring oscillators, and an oscillator selector for selecting the internal clock signal of one of said ring oscillators from the plurality of ring oscillators;
   the frequency controller further controls the oscillator selector to select a different ring oscillator from the plurality of ring oscillators, based on the comparison result.

10. A programmable clock signal generation circuit for generating a main clock signal, comprising:
   a first oscillator unit having:
      a plurality of programmable ring oscillators, each ring oscillator having multiple delay stages connected in series to form a ring, at least one of the delay stages having programmable delay to produce an internal clock signal with programmable frequency; and
      a first oscillator selector for selecting the internal clock signal of one of said ring oscillators of the first oscillator unit;
   a second oscillator unit having:
      a plurality of programmable ring oscillators, each ring oscillator having multiple delay stages connected in series to form a ring, at least one of the delay stages having programmable delay to produce an internal clock signal with programmable frequency; and
      a second oscillator selector for selector for selecting the internal clock signal of one of said ring oscillators of the second oscillator unit;
   a unit selector for selecting one of the firs and second oscillator units as a main oscillator unit to produce the main clock signal from the internal clock signal of the main oscillator unit, and selecting the other one of the first and second oscillator units as a secondary oscillator unit to produce a secondary clock signal form the internal clock signal of the secondary oscillator unit;
   a comparator for comparing the programmable frequency of the internal clock signal of a secondary oscillator unit with a reference frequency to produce a comparison result;
   a frequency controller for adjusting the programmable frequency of the internal clock signal of the secondary oscillator unit and controlling the first and second oscillator selectors to select a different ring oscillator from the secondary oscillator unit, based on the comparison result; and
   a unit controller for controlling the unit selector to switch the selection between the main oscillator unit and the secondary oscillator unit when frequency adjustment of the secondary oscillator unit is completed.

11. A method for generating a main clock signal with a target frequency using a programmable clock signal generation circuit having two oscillator units, each unit having a programmable ring oscillator containing multiple delay stages connected in series to form a ring, at least one of the delay stages having programmable delay to produce an internal clock signal with programmable frequency;
   the method comprising the steps of:
      selecting one of the oscillator units as a main oscillator unit to produce the main clock signal from the internal clock signal of the main oscillator unit, and selecting the other one of the oscillator units as a secondary oscillator unit to produce a secondary clock signal from the internal clock signal of the secondary oscillator unit;
      adjusting the programmable frequency of the internal clock signal of the secondary oscillator unit wiht a reference frequency to produce the internal clock signal with the target frequency;
      switching the selection between the main oscillator unit and the secondary oscillator unit when frequency adjustment of the secondary oscillator unit it completed; and
      repeating the steps of adjusting and switching.

12. A programmable clock signal generation circuit for generating a main clock signal, comprising:
   a programmable ring oscillator having multiple delay stages connected in series to form a ring, at lest one of the delay stages having programmable delay to produce an oscillator output signal of programmable frequency, the one of the delay stages having:
      a delay stage input for receiving a delay stage input signal;
      a delay stage output for outputting a delay stage output signal;
      a first logic gate connected between the delay stage input and the delay stage output, the first logic gate being enabled during operation of the ring oscillator; and
      a second logic gate connected between the delay stage input and the delay stage output in parallel to the first logic gate, the second logic gate receiving a gate enable signal, the second logic gate being disabled to provide the delay stage output signal with a first impedance and a first frequency when the gate enable signal is inactive, and the second logic gate being enabled to provide the delay stage output signal with a second impedance and a second frequency when the gate enable signal is active, so that the second impedance is smaller than the first impedance, which causes the second frequency to be greater than the first frequency;

a comparator for comparing the programmable frequency of the oscillator output signal with a reference frequency to produce a comparison result; and a frequency controller for adjusting the programmable frequency of the oscillator output signal, based on the comparison result.

13. The programmable clock signal generation circuit as claimed in claim 12, wherein the first logic gate and the second logic gate are 3-state logic gates of identical design.

14. The programmable clock signal generation circuit as claimed in claim 12, wherein the first logic gate comprises a plurality of logic gates of identical design connected in parallel.

15. The programmable clock signal generation circuit as claimed in claim 12, wherein the first logic gate receives an oscillator enabling signal, the first logic gate is enabled when the oscillator enabling signal is active, and the first logic gate is disabled when the oscillator enabling signal is inactive; and the one of the delay stages further comprises a reset control logic gate connected between the delay stage input and the delay stage output in parallel to the first logic gate and the second logic gate, the reset control logic gate receives an inverted signal of the oscillator enabling signal, the reset control logic gate drives the delay stage output signal to a constant value when the oscillator enabling signal is inactive to accomplish a reset function of the ring oscillator.

16. The programmable clock signal generation circuit as claimed in claim 12, wherein the one of the delay stages further comprises a load capacitance unit connected to the delay stage output for providing a capacitance to the one of the delay stages.

17. A method for providing a main clock signal with a target frequency using a programmable clock signal generation circuit having a programmable ring oscillator containing multiple delay stages connected in series to form a ring, at least one of the delay stages having programmable delay to produce an internal clock signal of programmable frequency, the one of the delay stages having:

a delay stage input for receiving a delay stage input signal;

a delay stage output for outputting a delay stage output signal;

a first logic gate connected between the delay stage input and the delay stage output, the first logic gate being enabled during operation of the ring oscillator; and a second logic gate connected between the delay stage input and the delay stage output in parallel to the first logic gate, the second logic gate receiving a gate enable signal, the second logic gate being disabled to provide the delay stage output signal with a first impedance and a first frequency when the gate enable signal is inactive, and the second logic gate being enabled to provide the delay stage output signal with a second impedance and a second frqeuncy when the gate enable signal is active, so that the second impedance is smaller than the first impedance, which causes the second frequency to be greater than the first frequency;

the method comprising the steps of:

forcing the logic level of the main clock signal to a predetermined constant value following a predetermined edge in the main clock signal;

adjusting the programmable frequency of a selected ring oscillator;

resetting the selected ring oscillator so that the internal clock signal becomes the same logic level as the main clock signal;

disabling said forcing of the logic level of the main clock signal; and re-enabling the selected ring oscillator so that it begins to oscillate and the internal clock signal drives said main clock signal with the target frequency.

18. The method as claimed in claim 17, wherein the first logic gate comprises a plurality of logic gates of identical design connected in parallel.

19. A programmable ring oscillator for generating an oscillator output signal with programmable frqeuncy, the ring oscillator comprising multiple delay stages connected in series to form a ring, at lest one of the delay stags having:

a delay stage input for receiving a delay stage input signal;

a delay stage output for outputting a delay stage output signal;

a first logic gate connected between the delay stage input and the delays stage output, the first logic gate being enabled during operation of the ring oscillator; and a second logic gate connected between the delay stage input and the delay stage output in parallel to the first logic gate, the second logic gate receiving a gate enable signal, the second logic gate being disabled to provide the delay stage output signal with a first impedance and a first frequency when the gate enable signal is inactive, and the seonc logic gate being enabled to provide the delay stage output signal with a second impedance and a second frequency when the gate enable signal is active, so that the second impedance is smaller than the first impedance, which causes the second frequency to be greater than the first frequency.

20. The programmable ring oscillator as claimed in claim 19, wherein the first logic gate and the second logic gate are 3-state logic gates of identical design.

21. The programmable ring oscillator as claimed in claim 19, wherein the first logic gate comprises a plurality of logic gates of identical design connected in parallel.

22. The programmable ring oscillator as claimed in claim 19, wherein the first logic gate receives an oscillator enabling signal, the first logic gate is enabled when the oscillator enabling signal is active, and the first logic gate is disabled when the oscillator enabling signal is inactive; and the one of the delay stages further comprises a reset control logic gate connected between the delay stage input and the delay stage output in parallel to the first logic gate and the second logic gate, the reset control logic gate receives an inverted signal of the oscillator enabling signal, the reset control logic gate drives the delay stage output signal to a constant value when the oscillator enabling signal is inactive to accomplish a reset function of the ring oscillator.

23. The programmable ring oscillator as claimed in claim 19, wherein the one of the delay stages further comprises a load capacitance unit connected to the delay stage output for providing a capacitance to the one of the delay stages.

24. A programmable ring oscillator unit for generating a clock signal, the ring oscillator unit comprising:

a plurality of programmable ring oscillators, each ring oscillator having multiple delay stages connected in series to form a ring, at least one of the delay stages having programmable delay to produce an internal clock signal of programmable frequency, the one of the delay stages having:

a delay stage input for receiving a delay stage input signal;

a delay stage output for outputting a delay stage output signal;

a first logic gate connected between the delay stage input and the delay stage output, the first logic gate being enabled during operation of the ring oscillator; and a second logic gate connected between the delay stage input and the delay stage output in parallel to the first logic gate, the second logic gate receiving a gate enable signal, the second logic gate being disabled to provide the delay stage output signal with a first impedance and a first frequency when the gate enable signal is inactive, and the second logic gate being enabled to provide the delay stage output signal with a second impedance and a second frequency when the gate enable signal is active, so that the second impedance is smaller than the first impedance, which causes the second frequency to be greater than the first frequency; and an oscillator selector for selecting the internal clock signal of one of said ring oscillators to produce the oscillator unit clock signal.

25. The programmable ring oscillator unit as claimed in claim 24, wherein the first logic gate and the second logic gate are 3-state logic gates of identical design.

26. The programmable ring oscillator unit as claimed in claim 24, wherein the first logic gate comprises a plurality of logic gate of identical design connected in parallel.

27. The programmable ring oscillator unit as claimed in claim 24, wherein the first logic gate receives an oscillator enabling signal, the first logic gate is enabled when the oscillator enabling signal is active, and the first logic gate is disabled when the oscillator enabling signal is inactive; and the one of the delay stages further comprises a reset control logic gate connected between the delay stage input and the delay stage output in parallel to the first logic gate and the second logic gate, the reset control logic gate receiving an inverted signal of the oscillator enabling signal, the reset control logic gate drives the delay stage output signal to a constant value when the oscillator enabling signal is inactive to accomplish a reset function of the ring oscillator.

28. The programmable ring oscillator unit as claimed in claim 24, wherein the one of the delay stages further comprises a load capacitance unit, connected to the delay stage output for providing a capacitance to the one of the delay stages.

* * * * *

UNITED STATES PATENT AND TRADEMARK OFFICE
CERTIFICATE OF CORRECTION

PATENT NO. : 6,204,694 B1
DATED : March 20, 2001
INVENTOR(S) : Stephen K. Sunter and Aubin P.J. Roy Page 1 of 1

It is certified that error appears in the above-identified patent and that said Letters Patent is hereby corrected as shown below:

Column 17,
Line 60, "based on eh" should be -- based on the --

Column 18,
Line 22, "logic gate" should be -- logic gates --

Column 19,
Line 13, "at least on" should be -- at least one --
Line 63, "selector for selector selecting" should be -- selector for selecting --
Line 66, "the firs and second" should be -- the first and second --

Column 20,
Line 4, "a secondary clock signal form" should be -- a secondary clock signal from --
Line 37, "oscillator unit wiht" should be -- oscillator unit with --
Line 42, "secondary oscillator unit it" should be -- secondary oscillator unit is --
Line 48 "at lest one" should be -- at least one --

Column 22,
Line 17, "at lest one" should be -- at least one --
Line 17, "delay stags" should be -- delay stages --
Line22 "delays stage output" should be -- delay stage output --
Line 31, "the seonc logic gate" should be -- the second logic gate --
Line 54, "gate receives" should be -- gate receiving --
Line 64, "generating a clock signal" should be -- generating a unit clock signal --

Column 24,
Line 17, "logic gate receiving" should be -- logic gate receives --

Signed and Sealed this

Sixteenth Day of October, 2001

Attest:

*Nicholas P. Godici*

NICHOLAS P. GODICI
*Attesting Officer*      *Acting Director of the United States Patent and Trademark Office*

UNITED STATES PATENT AND TRADEMARK OFFICE
CERTIFICATE OF CORRECTION

PATENT NO.    : 6,204,694 B1
DATED         : March 20, 2001
INVENTOR(S)   : Stephen Kenneth Sunter, Aubin P.J. Roy It is certified that error appears in the above-identified patent and that said Letters Patent is hereby corrected as shown below:

Column 1,
Lines 28-29, "place crystal" should be -- place a crystal --
Line 44, "have" should be -- save --
Line 52, "loci" should be -- logic --
Line 59, "deign" should be -- design --

Column 2,
Line 20, "inverts" should be -- inverters --

Column 3,
Line 47, "sage" should be -- stage --
Line 61, "high" should be -- higher --

Column 4,
Line 64, "form" should be -- from --

Column 6,
Line 10, "plurality of a ring" should be -- plurality of ring --

Column 7,
Line 49, "Using" should be -- Use --
Line 66, "stage" should be -- stages --

Column 8,
Line 27, "less than than" should be -- less than that --

Column 9,
Line 1, "(04)" should be -- (S04) --
Line 2, "(06)" should be -- (S06) --
Line 19, "Referring FIG. 7A" should be -- Referring to FIG. 7A --
Line 26, "two 3-stage" should be -- two 3-state --
Line 41, "capacitive" should be -- capacitance --
Line 46, "form" should be -- from --

Column 10,
Line 8, "increased" should be -- increase --
Line 27, "sages" should be -- stages --
Line 34, "performed" should be -- preferred --
Line 36, "3-stage" should be -- 3-state --
Line 46, "he" should be -- the --
Line 56, "form" should be -- from --

UNITED STATES PATENT AND TRADEMARK OFFICE
CERTIFICATE OF CORRECTION

PATENT NO.   : 6,204,694 B1
DATED        : March 20, 2001
INVENTOR(S)  : Stephen Kenneth Sunter, Aubin P.J. Roy It is certified that error appears in the above-identified patent and that said Letters Patent is hereby corrected as shown below:

Column 11,
Line 13, "Bitn-2)" should be -- Bit(n-2) --
Line 42, "82" should be -- 822 --

Column 12,
Line 8, "sages" should be -- stages --
Line 17, "stage" should be -- stages --
Line 45, "rang" should be -- range --
Line 50, "disconnecting" should be -- disconnection --
Line 60, "output" should be -- outputs --

Column 13,
Line 10, "form" should be -- from --
Line 36, "31" should be -- 931 --
Line 50, "form" should be -- from --
Line 60, "form" should be -- from --

Column 14,
Line 25, "include din" should be -- included in --
Line 40, "measure" should be -- measured --
Line 44, "it" should be -- its --
Line 46, "resoltuion" should be -- resolution --
Line 58, "used" should be -- use --

Column 15,
Line 43, "becomes" should be -- become --
Line 62, "research" should be -- search --
Line 66, "1102" should be -- 1103 --

Column 16,
Line 9, "control" should be -- controller --
Lines 13-14, "Swith-cOsc" should be -- SwitchOsc --
Line 16, "ocntroller" should be -- controller --
Line 19, "form" should be -- from --
Lines 21-22, "flip-flop flop 1127" should be -- flip-flop 1127 --
Line 43, "flip-flip" should be -- flip-flop --
Line 49, "unit" should be -- until --
Line 57, "sight" should be -- slight --
Line 61, "times" should be -- timed --

UNITED STATES PATENT AND TRADEMARK OFFICE
CERTIFICATE OF CORRECTION

PATENT NO. : 6,204,694 B1
DATED : March 20, 2001
INVENTOR(S) : Stephen Kenneth Sunter, Aubin P.J. Roy It is certified that error appears in the above-identified patent and that said Letters Patent is hereby corrected as shown below:

Column 17,
Line 14, "processes" should be -- process --
Lines 18-19, "implements" should be -- implemented --
Line 32, "position" should be -- portion --
Line 52, "of ring" should be -- of the ring --

Column 18,
Line 40, "generating" should be -- generation --

Column 21,
Line 60, "frqeuncy" should be -- frequency --

Column 22,
Line 15, "frqeuncy" should be -- frequency --

Column 24,
Line 6, "gate" should be -- gates --

Signed and Sealed this

Sixth Day of November, 2001

Attest:

NICHOLAS P. GODICI
Attesting Officer
Acting Director of the United States Patent and Trademark Office